(12) United States Patent
Cleary et al.

(10) Patent No.: US 8,821,640 B2
(45) Date of Patent: Sep. 2, 2014

(54) SOLID PRECURSOR-BASED DELIVERY OF FLUID UTILIZING CONTROLLED SOLIDS MORPHOLOGY

(75) Inventors: John M. Cleary, New Fairfield, CT (US); Jose I. Arno, Brookfield, CT (US); Bryan C. Hendrix, Danbury, CT (US); Donn Naito, Marble Falls, TX (US); Scott Battle, Cedar Park, TX (US); John N. Gregg, Marble Falls, TX (US); Michael J. Wodjenski, New Milford, CT (US); Chongying Xu, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 489 days.

(21) Appl. No.: 12/438,502

(22) PCT Filed: Aug. 31, 2007

(86) PCT No.: PCT/US2007/077466
§ 371 (c)(1),
(2), (4) Date: Jun. 2, 2009

(87) PCT Pub. No.: WO2008/028170
PCT Pub. Date: Mar. 6, 2008

(65) Prior Publication Data
US 2010/0255198 A1    Oct. 7, 2010

Related U.S. Application Data

(60) Provisional application No. 60/841,589, filed on Aug. 31, 2006.

(51) Int. Cl.
*C23C 16/54* (2006.01)
*C23C 16/44* (2006.01)
*C23C 16/00* (2006.01)
*C23C 16/448* (2006.01)

(52) U.S. Cl.
CPC ......... *C23C 16/4481* (2013.01); *C23C 16/4402* (2013.01)
USPC .......................................... 118/726; 392/389

(58) Field of Classification Search
None
See application file for complete search history.

(56) References Cited

U.S. PATENT DOCUMENTS

| | | | |
|---|---|---|---|
| 1,265,863 A | 5/1918 | Abbot | |
| 2,447,789 A | 8/1948 | Barr | |

(Continued)

FOREIGN PATENT DOCUMENTS

| | | |
|---|---|---|
| DE | 3931189 A1 | 3/1991 |
| DE | 19638100 C1 | 3/1998 |

(Continued)

OTHER PUBLICATIONS

Boomsma et al., "Metal foams as compact high performance heat exchangers", Mechanics of Materials, vol. 35, pp. 1161-1176, 2003.*

(Continued)

*Primary Examiner* — Matthew Daniels
*Assistant Examiner* — Lisa Herring
(74) *Attorney, Agent, or Firm* — Hultquist, PLLC; Steven J. Hultquist; Maggie Chappuis

(57) ABSTRACT

Apparatus and method for volatilizing a source reagent susceptible to particle generation or presence of particles in the corresponding source reagent vapor, in which such particle generation or presence is suppressed by structural or processing features of the vapor generation system. Such apparatus and method are applicable to liquid and solid source reagents, particularly solid source reagents such as metal halides, e.g., hafnium chloride. The source reagent in one specific implementation is constituted by a porous monolithic bulk form of the source reagent material. The apparatus and method of the invention are usefully employed to provide source reagent vapor for applications such as atomic layer deposition (ALD) and ion implantation.

21 Claims, 9 Drawing Sheets

(56) References Cited

U.S. PATENT DOCUMENTS

| | | |
|---|---|---|
| 2,721,064 A | 10/1955 | Reichardt |
| 2,769,624 A | 11/1956 | Burnside |
| 2,902,574 A | 9/1959 | Gudmundsen et al. |
| 3,405,251 A | 10/1968 | Spriggs et al. |
| 3,647,197 A | 3/1972 | Holloway |
| 3,740,043 A | 6/1973 | Reed et al. |
| 3,834,682 A | 9/1974 | McPhee |
| 4,190,965 A | 3/1980 | Erickson |
| 4,916,828 A | 4/1990 | Yamane et al. |
| 5,020,476 A | 6/1991 | Bay et al. |
| 5,078,976 A | 1/1992 | Shibauchi et al. |
| 5,104,695 A | 4/1992 | Greer et al. |
| 5,336,324 A | 8/1994 | Stall et al. |
| 5,377,429 A | 1/1995 | Sandhu et al. |
| 5,476,547 A | 12/1995 | Mikoshiba et al. |
| 5,536,323 A | 7/1996 | Kirlin et al. |
| 5,553,188 A | 9/1996 | Ewing |
| 5,553,395 A | 9/1996 | Wen et al. |
| 5,603,169 A | 2/1997 | Kim |
| 5,711,354 A | 1/1998 | Siegele et al. |
| 5,722,184 A | 3/1998 | Onoe et al. |
| 5,764,849 A | 6/1998 | Atwell |
| 5,904,771 A | 5/1999 | Tasaki et al. |
| 5,917,140 A | 6/1999 | Tom |
| 6,039,808 A | 3/2000 | Toyoda et al. |
| 6,107,634 A | 8/2000 | Horsky |
| 6,136,725 A | 10/2000 | Loan et al. |
| 6,143,191 A | 11/2000 | Baum et al. |
| 6,202,591 B1 | 3/2001 | Witzman et al. |
| 6,210,485 B1 | 4/2001 | Zhao et al. |
| 6,237,529 B1 | 5/2001 | Spahn |
| 6,254,792 B1 | 7/2001 | Van Buskirk et al. |
| 6,270,839 B1 | 8/2001 | Onoe et al. |
| 6,288,403 B1 | 9/2001 | Horsky et al. |
| 6,409,839 B1 | 6/2002 | Sun et al. |
| 6,413,476 B1 | 7/2002 | Barnhart |
| 6,431,118 B1 | 8/2002 | Woltmann |
| 6,443,435 B1 | 9/2002 | Hendrickson |
| 6,470,144 B1 | 10/2002 | Tarutani et al. |
| 6,473,564 B1 | 10/2002 | Nagashima et al. |
| 6,581,915 B2 | 6/2003 | Bartsch et al. |
| 6,607,785 B2 | 8/2003 | Timmons et al. |
| 6,616,766 B2 | 9/2003 | Dunham |
| 6,620,225 B2 | 9/2003 | Wang et al. |
| 6,620,256 B1 | 9/2003 | Arno et al. |
| 6,701,066 B2 | 3/2004 | Sandhu |
| 6,718,126 B2 | 4/2004 | Lei |
| 6,779,378 B2 | 8/2004 | Bondestam |
| 6,797,337 B2 | 9/2004 | Dando et al. |
| 6,837,939 B1 | 1/2005 | Klug et al. |
| 6,841,141 B2 | 1/2005 | Arno et al. |
| 6,863,021 B2 | 3/2005 | Sneh |
| 6,887,337 B2 | 5/2005 | Lebouitz et al. |
| 6,905,541 B2 | 6/2005 | Chen et al. |
| 6,909,839 B2 | 6/2005 | Wang et al. |
| 6,915,592 B2 | 7/2005 | Guenther |
| 6,921,062 B2 * | 7/2005 | Gregg et al. ............ 261/23.1 |
| 6,991,671 B2 | 1/2006 | Brestovansky et al. |
| 7,018,940 B2 | 3/2006 | Dunham |
| 7,109,113 B2 | 9/2006 | Derderian |
| 7,122,085 B2 | 10/2006 | Shero et al. |
| 7,128,785 B2 | 10/2006 | Kaeppeler et al. |
| 7,186,385 B2 | 3/2007 | Ganguli et al. |
| 7,261,118 B2 | 8/2007 | Birtcher et al. |
| 7,300,038 B2 | 11/2007 | Gregg et al. |
| 7,413,767 B2 | 8/2008 | Bauch et al. |
| 7,484,315 B2 | 2/2009 | Suzuki et al. |
| 7,485,338 B2 | 2/2009 | Faguet |
| 7,487,956 B2 * | 2/2009 | Gregg et al. ............ 261/142 |
| 7,488,512 B2 | 2/2009 | Suzuki et al. |
| 7,524,374 B2 | 4/2009 | Chen et al. |
| 7,556,244 B2 * | 7/2009 | Gregg et al. ............ 261/23.1 |
| 7,638,002 B2 | 12/2009 | Suzuki et al. |
| 7,651,570 B2 | 1/2010 | Brcka |
| 7,708,835 B2 | 5/2010 | Suzuki et al. |
| 7,828,274 B2 * | 11/2010 | Gregg et al. ............ 261/142 |
| 7,846,256 B2 | 12/2010 | Suzuki |
| 8,128,073 B2 | 3/2012 | Gregg et al. |
| 8,444,120 B2 | 5/2013 | Gregg et al. |
| 8,708,320 B2 | 4/2014 | Steidl et al. |
| 2001/0008121 A1 | 7/2001 | Tanabe et al. |
| 2002/0145210 A1 | 10/2002 | Tompkins et al. |
| 2002/0192370 A1 | 12/2002 | Metzner et al. |
| 2003/0054099 A1 | 3/2003 | Jurgensen et al. |
| 2003/0101938 A1 | 6/2003 | Ronsse et al. |
| 2003/0111014 A1 | 6/2003 | Donatucci et al. |
| 2003/0116019 A1 | 6/2003 | Torkaman |
| 2003/0121608 A1 | 7/2003 | Chen et al. |
| 2003/0232138 A1 * | 12/2003 | Tuominen et al. ......... 427/248.1 |
| 2004/0165870 A1 | 8/2004 | Sandhu |
| 2005/0000427 A1 | 1/2005 | Lee et al. |
| 2005/0006799 A1 | 1/2005 | Gregg et al. |
| 2005/0072357 A1 * | 4/2005 | Shero et al. ............ 118/715 |
| 2005/0230046 A1 | 10/2005 | Lebouitz et al. |
| 2006/0037540 A1 | 2/2006 | Woelk et al. |
| 2006/0121198 A1 | 6/2006 | Shenai-Khatkhate et al. |
| 2006/0185597 A1 | 8/2006 | Suzuki et al. |
| 2007/0042119 A1 | 2/2007 | Matthysse et al. |
| 2007/0194470 A1 * | 8/2007 | Dedontney ............ 261/76 |
| 2007/0266949 A1 | 11/2007 | Shenai-Khatkhate et al. |
| 2008/0085226 A1 | 4/2008 | Fondurulia et al. |
| 2008/0092816 A1 | 4/2008 | Birtcher et al. |
| 2008/0191153 A1 | 8/2008 | Marganski et al. |

FOREIGN PATENT DOCUMENTS

| | | |
|---|---|---|
| EP | 0714999 A1 | 6/1996 |
| EP | 1 508 631 A1 | 2/2005 |
| EP | 1669474 A1 | 6/2006 |
| GB | 1559978 A | 1/1980 |
| JP | 55-160424 A | 12/1980 |
| JP | 58-126973 A | 7/1983 |
| JP | 60-070176 A | 4/1985 |
| JP | 2-107593 A | 4/1990 |
| JP | 04-228562 A | 8/1992 |
| JP | 04-292406 A1 | 10/1992 |
| JP | 04-333572 A | 11/1992 |
| JP | 5-98445 A | 4/1993 |
| JP | 05-098445 A1 | 4/1993 |
| JP | 08-279497 A | 10/1996 |
| JP | 2001-059161 A | 3/2001 |
| JP | 2002-270523 A | 9/2002 |
| KR | 10-2006-0064556 A | 6/2006 |
| WO | 9312266 A1 | 6/1993 |
| WO | 9421840 A1 | 9/1994 |
| WO | 9904061 A1 | 1/1999 |
| WO | 0065127 A1 | 11/2000 |
| WO | 0161071 A2 | 8/2001 |
| WO | 03004723 A1 | 1/2003 |
| WO | 2004011695 A2 | 2/2004 |
| WO | 2006009872 A1 | 1/2006 |
| WO | 2006101767 A2 | 9/2006 |
| WO | 2008028170 A1 | 3/2008 |
| WO | 2008045972 A2 | 4/2008 |

OTHER PUBLICATIONS

Palko et al., "The Vapor Pressures of Zirconium Tetrachloride and Hafnium Tetrachloride", J. Phys. Chem., 1958, vol. 62, pp. 319-322.*

* cited by examiner

US 8,821,640 B2

SOLID PRECURSOR-BASED DELIVERY OF FLUID UTILIZING CONTROLLED SOLIDS MORPHOLOGY

CROSS-REFERENCE TO RELATED APPLICATIONS

This application is a U.S. national phase under the provisions of 35 U.S.C. §371 of International Application No. PCT/US07/77466 filed on Aug. 31, 2007, which in turn claims priority of U.S. Provisional Patent Application No. 60/841,589 filed on Aug. 31, 2006. The disclosures of such international application and U.S. priority application are hereby incorporated herein by reference in their respective entireties, for all purposes.

FIELD OF THE INVENTION

The present invention relates to vaporizer apparatus and systems, and related methodologies for vaporization of source reagent materials, such as liquid and solid source reagents used in chemical vapor deposition (CVD), atomic layer deposition (ALD) and ion implantation processes.

DESCRIPTION OF THE RELATED ART

In the use of liquids and solid materials as source reagents for vapor in CVD, ALD and ion implantation, various reagents are employed, which are heated to form the source reagent vapor for deposition or implantation.

One issue relating to the use of such liquid and solid source reagents for vapor generation relates to the need for thermal homogeneity. Specifically, the source reagent must be heated uniformly without cold spots or hot spots in the source reagent material, so that the vapor generation is as uniform and controllable as possible.

In this respect, there are significant differences in the characteristics of various source reagents, as to their boiling points, melting points, and sublimation temperatures (in the case of sublimable solid source reagents), and their susceptibility to thermal decomposition during heating with regard to the production of unwanted by-products. The objective of the source reagent vaporization is to vaporize the source reagent at a controlled rate such that a reproducible flow of vapor can be delivered in the desired amount to downstream process equipment, with minimum production of by-products.

Solid source reagents are particularly difficult to control in volatilization applications where sublimation temperatures are close to temperatures at which thermal disassociation occurs and yields thermal degradation by-products that are detrimental to the downstream deposition or ion implantation process.

The art continues to seek improvements in vaporizer systems used for volatilizing source reagents to produce source reagent vapor for deposition and ion implantation applications.

SUMMARY OF THE INVENTION

The present invention relates to vaporizer apparatus and systems, and related methodologies for vaporization of source reagent materials, such as liquid and solid source reagents used in chemical vapor deposition (CVD), atomic layer deposition (ALD) and ion implantation processes, as well as in forming coatings on substrates, and in cleaning applications, e.g., use of reagent materials such as $XeF_2$ for cleaning of chambers of process equipment for manufacturing semiconductor and microelectronic products.

The invention in one aspect relates to a vaporizer comprising a vaporizer vessel adapted to hold a source reagent, said vaporizer being adapted for heating of said vaporizer vessel and the source reagent therein, to generate vapor deriving from said source reagent, wherein said source reagent is susceptible to generation or presence of particles in said vapor, said vessel defining an enclosed interior volume, and having at least one port, whereby vapor deriving from said source reagent is dischargeable from said interior volume of the vessel, wherein the vaporizer includes at least one structural conformation selected from among (A) to (H):

(A) a first conformation comprising at least one protrusion element in said interior volume adapted to contact the source reagent therein, and at least one particle suppression feature other than a frit, wherein said particle suppression feature reduces the generation or presence of particles in vapor deriving from said source reagent, in relation to a corresponding vaporizer lacking such particle suppression feature;

(B) a second conformation comprising a cover securable to said vessel to enclose said interior volume, said cover including inlet and outlet ports, whereby said carrier gas is introduceable to said interior volume through said inlet port, and a carrier gas mixture including said carrier gas and vapor deriving from said source reagent is dischargeable from said interior volume through said output port, with at least one support element in said interior volume adapted to support the source reagent therein, and at least one particle suppression feature other than a frit, wherein said particle suppression feature reduces the generation or presence of particles in the carrier gas mixture, in relation to a corresponding vaporizer lacking such particle suppression feature;

(C) a third conformation comprising in said vessel an ionic liquid as a storage medium for said source reagent, from which the source reagent is released under source reagent dispensing conditions;

(D) a fourth conformation comprising a source reagent in solid form in said vessel, wherein said solid form comprises powder having a predetermined particle size range and distribution for said heating, wherein said predetermined particle size range and distribution include particles sized for avoidance of entrainment of particles in the vapor during generation of said vapor;

(E) a fifth conformation comprising a monolithic porous solid source reagent body;

(F) a sixth conformation comprising at least one porous thermally conductive body in said interior volume adapted to support the source reagent in porosity thereof;

(G) a seventh conformation comprising a plurality of discrete support elements in such vessel interior volume in thermal contact with the wall and adapted to support solid source material in the interior volume, for heating of the solid source material to form a solid source material vapor; and (H) an eighth conformation comprising an interior structure in the interior volume of the vessel and in contact with the vessel, and a source reagent material in contact with the interior structure, said source material including an outer crusted portion that is heatable to generate a source material vapor for egress from the vessel in dispensing operation of the vaporizer.

In another aspect, the invention relates to a vaporizer comprising a vaporizer vessel adapted to hold a source reagent, said vaporizer being adapted for heating of said vaporizer vessel and the source reagent therein, to generate vapor deriving from said source reagent, wherein said source reagent is susceptible to generation or presence of particles in said vapor, said vessel defining an enclosed interior volume, and having at least one port, whereby vapor deriving from said source reagent is dischargeable from said interior volume of the vessel, with at least one support element in said interior volume adapted to support or otherwise contact the source reagent therein, and at least one particle suppression feature other than a frit, wherein said particle suppression feature reduces the generation or presence of particles in vapor deriving from said source reagent, or otherwise from a source of particles, in relation to a corresponding vaporizer lacking such particle suppression feature.

The particle suppression feature is a structure, characteristic or material that reduces the generation or presence of particles in the vapor deriving from said source reagent, in relation to a corresponding vaporizer lacking such particle suppression feature. The particle suppression feature in one embodiment comprises a foam material, e.g., a thermally conductive foam material. The foam material may also serve as a support or containment or retention medium for the source reagent.

The invention relates in another aspect to a vaporizer comprising a vaporizer vessel adapted to hold a source reagent for contacting with a carrier gas introduced into the vessel for said contacting, said vaporizer being adapted for heating of said vaporizer vessel and the source reagent therein, to generate vapor deriving from said source reagent, wherein said source reagent is susceptible to generation or presence of particles in said vapor, said vessel defining an interior volume, a cover securable to said vessel to enclose said interior volume, inlet and outlet ports, whereby said carrier gas is introduceable to said interior volume through said inlet port, and a carrier gas mixture including said carrier gas and vapor deriving from said source reagent is dischargeable from said interior volume through said output port, with at least one support element in said interior volume adapted to support the source reagent therein, and at least one particle suppression feature other than a frit, wherein such particle suppression feature reduces the generation or presence of particles in vapor deriving from said source reagent, in relation to a corresponding vaporizer lacking such particle suppression feature.

In another aspect, the invention relates to a vaporizer comprising a vaporizer vessel holding solid source reagent therein, such vaporizer being adapted for heating of said vaporizer vessel and the source reagent therein, to generate vapor deriving from said source reagent, wherein said solid source reagent comprises a material selected from the group comprising dimethyl hydrazine, trimethyl aluminum (TMA), hafnium chloride ($HfCl_4$), zirconium chloride ($ZrCl_4$), indium trichloride, indium monochloride, aluminum trichloride, titanium iodide, tungsten carbonyl, $Ba(DPM)_2$, bis di pivaloyl methanato strontium ($Sr(DPM)_2$), $TiO(DPM)_2$, tetra di pivaloyl methanato zirconium ($Zr(DPM)_4$), decaborane, octadecaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide ($Zr(t-OBu)_4$), tetrakisdiethylaminozirconium ($Zr(Net_2)_4$), tetrakisdiethylaminohafnium ($Hf(Net_2)_4$), tetrakis(dimethylamino)titanium (TDMAT), tertbutyliminotris(deithylamino)tantalum (TBTDET), pentakis(demethylamino)tantalum (PDMAT), pentakis(ethylmethylamino)tantalum (PEMAT), tetrakisdimethylaminozirconium ($Zr(NMe_2)_4$), hafniumtertiarybutoxide ($Hf(tOBu)_4$), xenon difluoride ($XeF_2$), xenon tetrafluoride ($XeF_4$), xenon hexafluoride ($XeF_6$), and compatible combinations and mixtures of two or more of the foregoing.

In one embodiment, specific solid source reagents in the practice of the invention include decaborane, hafnium tetrachloride, zirconium tetrachloride, indium trichloride, metalorganic β-diketonate complexes, tungsten hexafluoride, cyclopentadienylcycloheptatrienyl-titanium ($C_p$TiCht), aluminum trichloride, titanium iodide, cyclooctatetraenecyclopentadienyltitanium, biscyclopentadienyltitaniumdiazide, trimethyl gallium, trimethyl indium, aluminum alkyls like trimethylaluminum, triethylaluminum, trimethylamine alane, dimethyl zinc, tetramethyl tin, trimethyl antimony, diethyl cadmium and tungsten carbonyl.

In another embodiment, the source reagent comprises elemental boron, copper and phosphorus; decaborane; metal halides such as gallium halides, indium halides, antimony halides, arsenic halides, gallium halides, aluminum iodide, titanium iodide; metalorganic complexes, such as, cyclopentadienylcycloheptatrienyltitanium ($C_p$TiCht), cyclooctatetraenecyclopenta-dienyltitanium, biscyclopentadienyltitanium-diazide, $In(CH_3)_2$(hfac), dibromomethyl stibine and tungsten carbonyl, as well as metalorganic β-diketonate complexes, metalorganic alkoxide complexes, metalorganic carboxylate complexes, metalorganic aryl complexes and metalorganic amido complexes.

In yet another specific embodiment, the present invention may be used with any type of source material that can be liquefied either by heating or solubilization in a solvent including, but not limited to, decaborane, ($B_{10}H_{14}$), pentaborane ($B_5H_9$), octadecaborane ($B_{18}H_{22}$), boric acid ($H_3BO_3$), $SbCl_3$, and $SbCl_5$. Other source materials that may find application in specific embodiments of the invention include, without limitation, $AsCl_3$, $AsBr_3$, $AsF_3$, $AsF_5$, $AsH_3$, $As4O_6$, $As_2Se_3m$ $As_2S_2$, $As_2S_3$, $As_2S_5$, $As_2Te_3$, $B_4H_{11}$, $B_4H_{10}$, $B_3H_6N_3$, $BBr_3$, $BCl_3$, $BF_3$, $BF_3.O(C_2H_5)_2$, $BF_3.HOCH_3$, $B_2H_6$, $F_2$, HF, $GeBr_4$, $GeCl_4$, $GeF_4$, $GeH_4$, $H_2$, HCl, $H_2Se$, $H_2Te$, $H_2S$, $WF_6$, $SiH_4$, $SiH_2Cl_2$, $SiHCl_3$, $SiCl_4$, $SiH_3Cl$, $NH_3$, $NH_3$, Ar, $Br_2$, HBr, $BrF_5$, $CO_2$, CO, $COCl_2$, $COF_2$, $Cl_2$, $ClF_3$, $CF_4$, $C_2F_6$, $C_3F_8$, $C_4F_8$, $C_5F_8$, $CHF_3$, $CH_2F_2$, $CH_3F$, $CH_4$, $SiH_6$, He, HCN, Kr, Ne, $Ni(CO)_4$, $HNO_3$, NO, $N_2$, $NO_2$, $NF_3$, $N_2O$, $C_8H_{24}O_4Si_4$, $PH_3$, $POCl_3$, $PCl_5$, $PF_3$, $PF_5$, $SbH_3$, $SO_2$, $SF_6$, $SF_4$, $Si(OC_2H_5)_4$, $C_4H_{16}Si_4O_4$, $Si(CH_3)_4$, $SiH(CH_3)_3$, $TiCl_4$, Xe, $SiF_4$, $WOF_4$, $TaBr_5$, $TaCl_5$, $TaF_5$, $Sb(C_2H_5)_3$, $Sb(CH_3)_3$, $In(CH_3)_3$, $PBr_5$, $PBr_3$, and $RuF_5$ In addition, solvents (organic or inorganic) containing forms of arsenic, phosphorus, antimony, germanium, indium, tin, selenium, tellurium, fluorine, carbon, boron, aluminum, bromine, carbon, chlorine, nitrogen, silicon, tungsten, tantalum, ruthenium, selenium, nickel, and sulfur may be used in the present invention.

A further aspect of the invention relates to a vapor delivery system comprising a vaporizer as described hereinabove, and flow circuitry coupled with the vaporizer for flowing said vapor to a fluid-utilizing apparatus or region, wherein said vapor is in a neat form or is in mixture with a carrier gas.

The invention relates in another aspect to a vaporizer comprising a vaporizer vessel adapted to hold a source reagent for contacting with a carrier gas introduced into the vessel for such contacting, the vaporizer being adapted for heating of said vaporizer vessel and the source reagent therein, to generate vapor deriving from said source reagent, the vessel defining an interior volume, a closure member, e.g., a cover securable to the vessel to enclose the interior volume, such closure member in one embodiment including inlet and outlet ports, whereby the carrier gas is introduceable to the interior volume through the inlet port, and a carrier gas mixture, optionally including a vaporization enhancement component such as a complexing agent, in mixture with the carrier gas and vapor deriving from said source reagent is dischargeable from said interior volume through the output port, wherein the vaporizer holds an ionic liquid containing said source reagent therein.

Yet another aspect of the invention relates to a method of generating vapor from a solid source reagent powder by heating thereof to generate said vapor, said method comprising sifting of said powder to recover powder having a predetermined particle size range and distribution for said heating, wherein said predetermined particle size range and distribution include particles sized for avoidance of entrainment of particles in the vapor during generation of said vapor.

A further aspect of the invention relates to a method of generating vapor from a solid source reagent powder susceptible to generation of particulate solids in said vapor upon generation thereof by heating the solid source reagent powder, said method comprising providing said solid source reagent powder with a particle size, composition and morphology favorable to reduce the presence and extent of particle generation upon said heating, relative to the solid source reagent powder.

Another aspect of the invention relates to a method of making a porous solid source reagent article for use in generating vapor by heating of said article, said method comprising providing source reagent in the form of a powder, and consolidating the powder under heat and pressure to yield a porous solid source reagent article.

In another aspect, the invention relates to a method of forming a porous source reagent article for exposure to elevated temperature conditions producing sublimation of said source reagent, comprising mixing a fugitive medium with said source reagent in powder form to form a mixture, shaping the mixture to form a composite body of said fugitive medium and source reagent, and effecting removal of said fugitive medium from said composite body, to produce a porous source reagent article.

A further aspect of the invention relates to a method of generating vapor of a solid source reagent, comprising providing said solid source reagent in a vaporizer vessel, and heating said vaporizer vessel to volatilize the solid source reagent and produce source reagent vapor, such method comprising suppressing the presence of particles in said source reagent vapor with a particle suppression feature other than a frit.

Another aspect of the invention relates to a porous monolithic shaped article formed of or comprising a sublimable source reagent. The monolith article in various embodiments can comprise a source reagent, e.g., a sublimable source reagent, or the monolith article may be adapted for storing a liquid or solid source reagent, and in such case the monolith article can be loaded with liquid or solid source material, prior to, during, or after installation of the monolith aide in the vaporizer vessel.

In another aspect, the invention relates to a vaporizer including a vaporizer vessel including a contact enhancement material therein, such as a support structure material, providing additional surface area in the vessel for containing or otherwise presenting the source reagent (e.g., a mesh, wool, or other medium), or an ionic liquid material, or the like, by which the source reagent associated therewith can be volatilized.

A further aspect of the invention relates to a vaporizer comprising a vaporizer vessel adapted to hold a source reagent for contacting with a carrier gas introduced into the vessel for said contacting, said vaporizer being adapted for heating of said vaporizer vessel and the source reagent therein, to generate vapor deriving from said source reagent, wherein said source reagent is susceptible to generation or presence of particles in said vapor, said vessel defining an interior volume, a cover securable to said vessel to enclose said interior volume, said cover including inlet and outlet ports, whereby said carrier gas is introduceable to said interior volume through said inlet port, and a carrier gas mixture including said carrier gas and vapor deriving from said source reagent is dischargeable from said interior volume through said output port, with at least one porous metal body in said interior volume adapted to support the source reagent in porosity thereof.

Still another aspect of the invention relates to a method of generating a vapor from a volatilizable solid subjected to heating in a vaporizer vessel, such method comprising disposing at least one porous metal body in said vaporizer vessel, wherein said porous metal body contains said volatilizable solid in porosity thereof.

The invention in another aspect relates to a vaporizer for a solid source material, comprising:

a single port vessel including a wall defining an enclosed interior volume;

a plurality of discrete support elements in such vessel interior volume in thermal contact with the wall and adapted to support solid source material in the interior volume, for heating of the solid source material to form a solid source material vapor; and the single port of the single port vessel being a discharge port communicating with the vessel interior volume and adapted for discharging solid source material vapor from the vessel.

The invention in yet another aspect relates to a method of manufacturing a microelectronic device, comprising use of a vapor dispensed from a vaporizer as variously described above.

An additional aspect of the invention relates to a vaporizer including a vaporizer vessel enclosing an interior volume and having at least one gas port communicating with the interior volume of the vessel, an interior structure in the interior volume of the vessel and contacting the vessel and a source reagent material in contact with the interior structure, said source material including an outer crusted portion that is heatable to generate a source material vapor for egress from the vessel in dispensing operation of the vaporizer.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
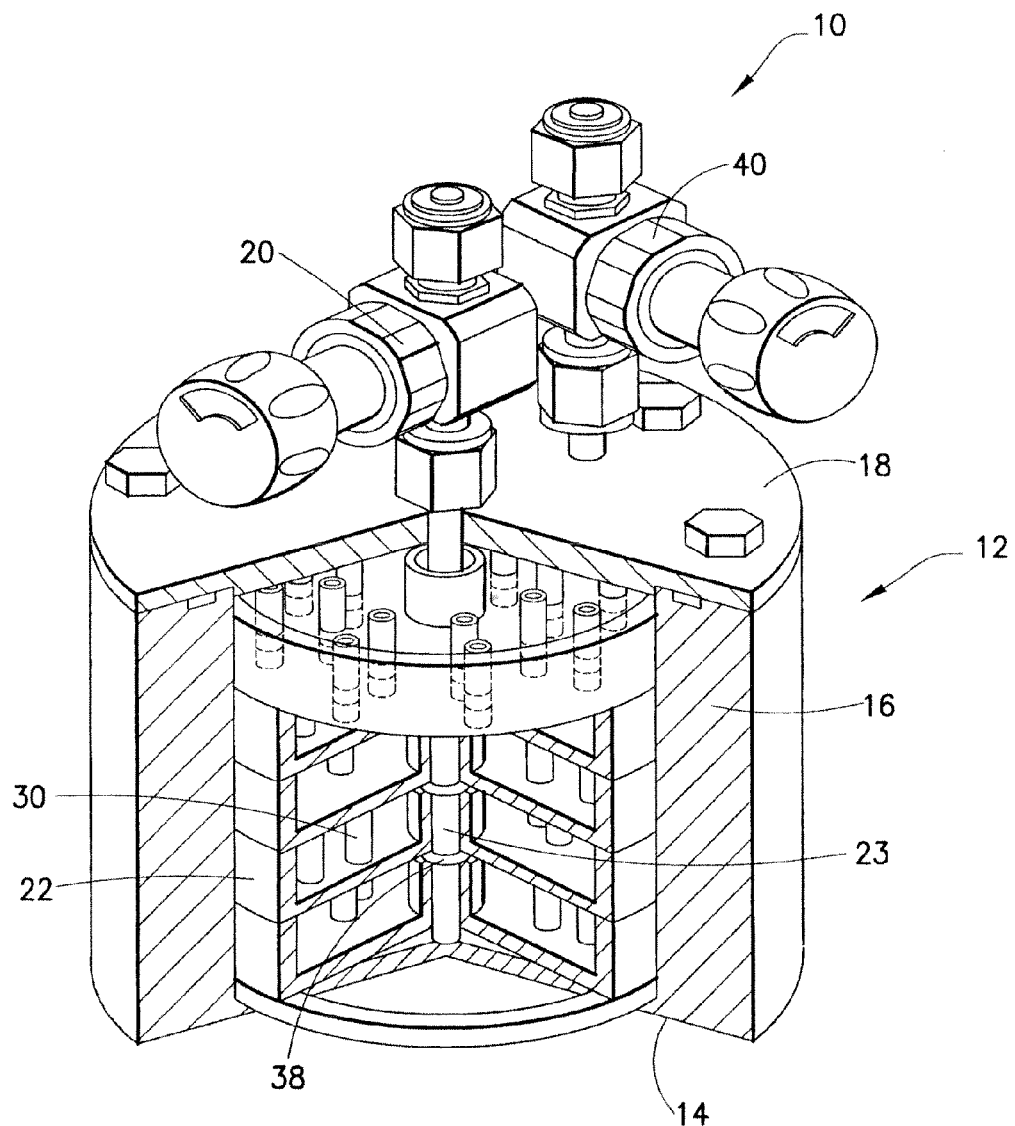
FIG. 1 is perspective view of a vaporizer of a type useful in various embodiments of the present invention.

The present invention relates to vaporizer apparatus, systems and methods for volatilization of source reagents to produce vapor for fluid-utilizing processes such as chemical vapor deposition or ion implantation.

The invention has applicability to various types of source reagents, including liquid and semi-solid source reagent materials (semi-solid source reagent materials being understood here to include flowable solids, solid suspensions, ionic liquid compositions, and the like), with particular utility for solid source reagent materials. Solid source reagent materials employed in the practice of the invention may for example be in the form of powders, granules, pellets, beads, bricks, blocks, sheets, rods, plates, films, coatings, etc., and may embody porous or nonporous forms, as desirable in a given application.

The invention is based on the discovery that various source reagents, e.g., metal halides such as hafnium chloride, are highly susceptible to the generation of particles when volatilized to produce source reagent vapor for fluid-utilizing applications such as chemical vapor deposition or ion implantation, and the related discovery of various techniques that may be employed to suppress particle formation and/or to capture particles that may be present in the vapor deriving from the source reagent.

The invention relates in another one aspect to a vaporizer comprising a vaporizer vessel adapted to hold a source reagent, such vaporizer being adapted for heating of the vaporizer vessel and the source reagent therein, to generate vapor deriving from the source reagent, wherein the source reagent is susceptible to generation or presence of particles in the vapor, the vessel defining an enclosed interior volume, and having at least one port, whereby vapor deriving from the source reagent is dischargeable from the interior volume of the vessel, wherein the vaporizer includes at least one structural conformation selected from among (A) to (H):

(A) a first conformation comprising at least one protrusion element in said interior volume adapted to contact the source reagent therein, and at least one particle suppression feature other than a frit, wherein said particle suppression feature reduces the generation or presence of particles in vapor deriving from said source reagent, in relation to a corresponding vaporizer lacking such particle suppression feature;

(B) a second conformation comprising a cover securable to said vessel to enclose said interior volume, said cover including inlet and outlet ports, whereby said carrier gas is introduceable to said interior volume through said inlet port, and a carrier gas mixture including said carrier gas and vapor deriving from said source reagent is dischargeable from said interior volume through said output port, with at least one support element in said interior volume adapted to support the source reagent therein, and at least one particle suppression feature other than a frit, wherein said particle suppression feature reduces the generation or presence of particles in the carrier gas mixture, in relation to a corresponding vaporizer lacking such particle suppression feature;

(C) a third conformation comprising in said vessel an ionic liquid as a storage medium for said source reagent, from which the source reagent is released under source reagent dispensing conditions;

(D) a fourth conformation comprising a source reagent in solid form in said vessel, wherein said solid form comprises powder having a predetermined particle size range and distribution for said heating, wherein said predetermined particle size range and distribution include particles sized for avoidance of entrainment of particles in the vapor during generation of said vapor;

(E) a fifth conformation comprising a monolithic porous solid source reagent body;

(F) a sixth conformation comprising at least one porous thermally conductive body in said interior volume adapted to support the source reagent in porosity thereof;

(G) a seventh conformation comprising a plurality of discrete support elements in such vessel interior volume in thermal contact with the wall and adapted to support solid source material in the interior volume, for heating of the solid source material to form a solid source material vapor; and (H) an eighth conformation comprising an interior structure in the interior volume of the vessel and in contact with the vessel, and a source reagent material in contact with the interior structure, said source material including an outer crusted portion that is heatable to generate a source material vapor for egress from the vessel in dispensing operation of the vaporizer.

Figure 2:
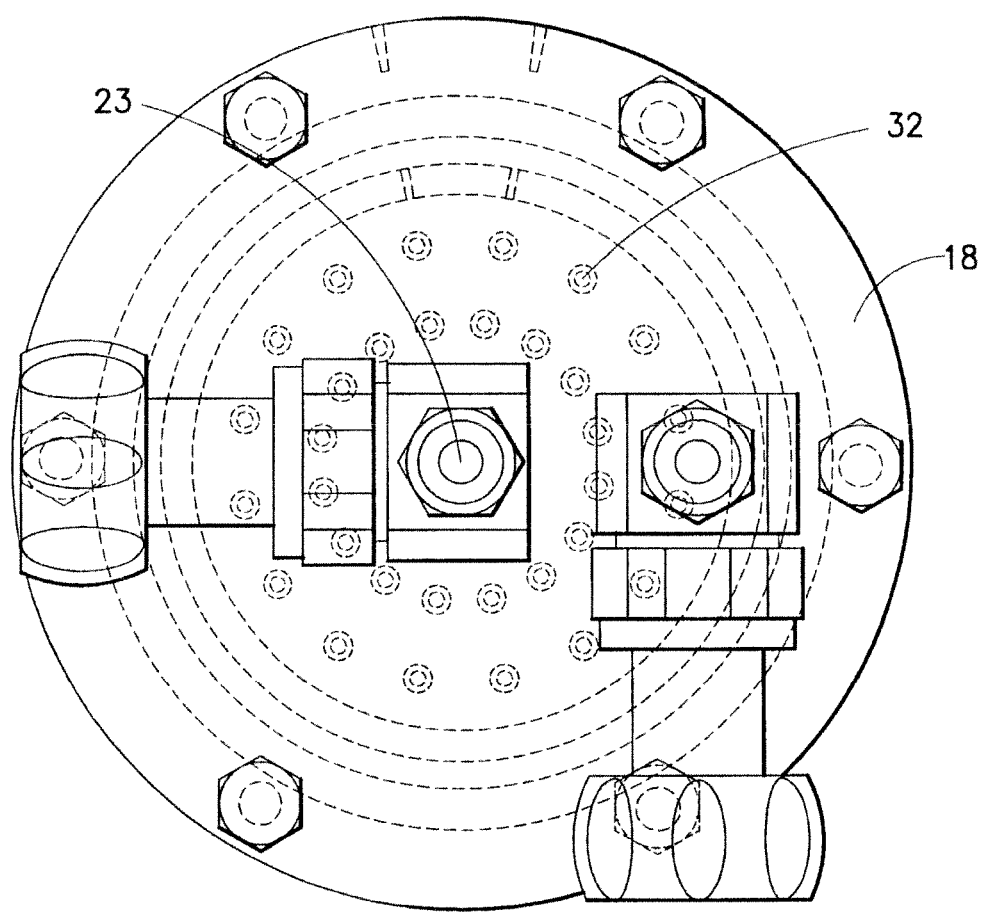
FIG. 2 is a top view of a plurality of vented through-tubes positioned in a vessel of a vaporizer of the type shown in FIG. 1.
Figure 3:
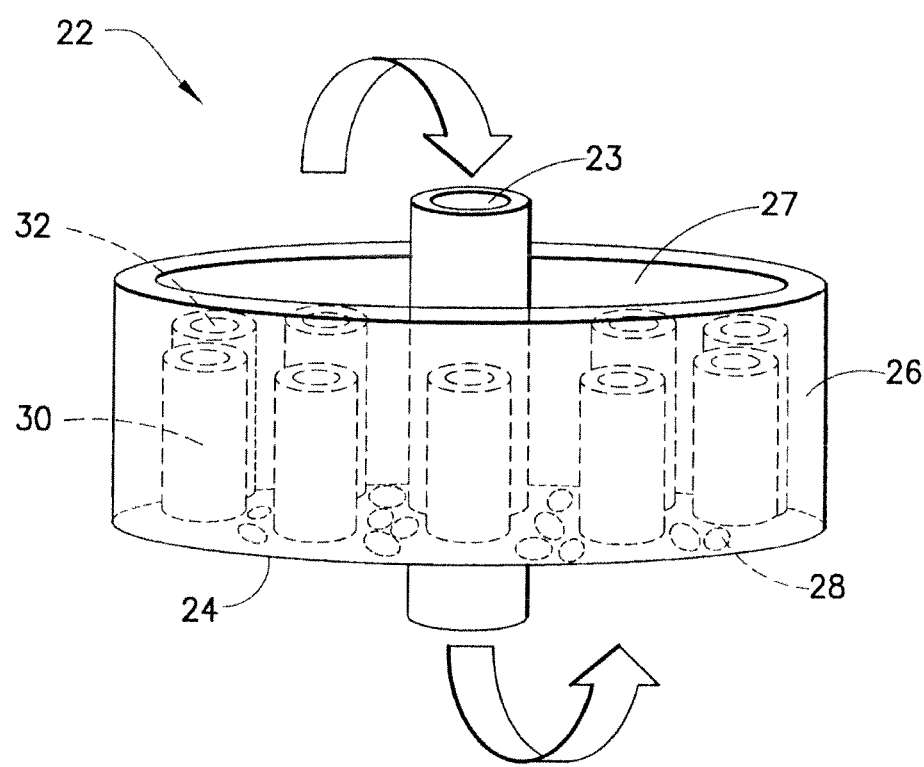
FIG. 3 is a side elevational view of a vaporizer vessel of a general type as shown in FIG. 1, illustrating a plurality of cylindrically shaped through-tubes.

A vaporizer of a type that is usefully employed in the practice of the present invention, in various specific embodiments thereof, is illustrated in FIG. 1. FIG. 2 is a top view of a plurality of vented through-tubes positioned in a vessel of a vaporizer of the type shown in FIG. 1. FIG. 3 is a side elevational view of a vaporizer vessel of a general type as shown in FIG. 1, illustrating a plurality of cylindrically shaped through-tubes.

The vaporizer delivery system 10 comprises a vessel 12, fabricated of a suitable heat-conducting material, such as for example silver, silver alloy, copper, copper alloy, aluminum, aluminum alloy, lead, nickel clad, stainless steel, graphite, silicon carbide coated graphite, boron nitride, ceramic material, etc., as well as combinations, mixtures and alloys of two or more of such types of material.

The vessel comprises a floor 14 and circumscribing sidewall 16 that together form an interior volume of the vessel. The vessel can have any shape that facilitates an even flow of carrier gas through the interior volume thereof. In one embodiment, the vessel has a cylindrical shape machined to very close tolerances (e.g., in a range of $1/1000^{th}$ to $3/1000^{th}$ of an inch).

The vessel includes a lid 18 on which is mounted a carrier gas inlet valve 20 arranged to selectively introduce carrier gas into the interior volume of the vessel, when the valve is open.

Positioned in the internal volume of the vessel is a plurality of vertically stacked trays 22. The stacked trays are separable from each other and removable from the vessel for easy cleaning and refilling. Positioned within the vessel is an internal carrier gas downtube 23 that is connected (welded) to a gas inlet in the lid associated with inlet valve 20 and conveys the carrier gas to the bottom of the internal volume below the lowest tray in the array of vertically stacked trays. In FIG. 1, the downtube 23 passes through a cylindrical collar 27 of each tray that extends through the floor 24 of the tray (see FIG. 3). It will be appreciated that to ensure a leak-proof seal at the juncture of the downtube with the floor 24 of the tray, a sealing O-ring 38 may be positioned between successive trays especially if the source material is a liquid. An additional outer o-ring can also be employed to seal between trays on the top surface of each tray sidewall.

When the source reagent is in a solid form, various structural elements may be employed to suppress or minimize the entrainment of solids in the carrier gas flow. Such entrainment-combating features may be of any suitable type, and may for example include frit elements as well as particle suppression features or devices other than frits. The particle suppression features other than fits can in various embodiments include tortuous flow paths, upflow solids disengagement structures, tangential gas flow side streams serving a particle aggregation or collection function, etc. By way of specific example, high purity stainless steel frits, e.g., having a pore size in a range of from 1 to 100 microns, and at least one particle suppression feature other than a frit, could be added at any suitable location to control the carrier gas flow rate. Frits could for example be installed at the 'inlet' of each through-tubes 30 associated with the trays, or a large disk frit could be added to the top tray and sealed therein by pressure from the installation of the lid on the vessel, or otherwise disposed in the outlet gas flow path.

As shown in FIG. 3, each of the individual trays 22 has a floor 24 and sidewall 26 to form a tray cavity 27 for placement and support of the source material 28. The trays are preferably fabricated of a non-reactive heat-conducting material, such as for example silver, silver alloy, copper, copper alloy, aluminum, aluminum alloy, lead, nickel clad, stainless steel, graphite, silicon carbide coated graphite, boron nitride, ceramic material, and combinations, mixtures and composites of two or more of the foregoing.

Each of the individual trays comprises a plurality of through-tubes 30 wherein each through-tube includes a passageway 32 for movement of a carrier gas through the through-tube. The through-tubes can have any shape or configuration that provides for flow of gas therethrough. Preferably, the through-tubes are cylindrical or conical in shape. The through-tubes in various embodiments extend upwardly from the floor of the tray and define a central passageway communicating with a corresponding opening in the tray floor. In other embodiments, the through-tubes extend upwardly from the floor the tray in the same manner, but also extend downwardly below the tray, so that the central passageway is enclosed by the through-tube, e.g., as a central bore thereof, both above and below the floor of the tray.

The through-tubes can be secured to the floor of the tray in any suitable matter, e.g., by welding, brazing, mechanical fastener attachment, press-fit, swaging, etc. In the alternative, the through-tubes can be integrally formed as part of the tray floor. In a specific embodiment, the height of each of the through-tubes is approximately the same height as that of the tray sidewall, although other embodiments are contemplated, in which the height of each of the through-tubes is greater or less than such sidewall.

The side walls of the respective trays may be of sufficient height, so that the trays are stackable to form a vertically extending stacked array in the interior volume of the vessel of the vaporizer.

In another specific embodiment, the trays can comprise isolated cartridges that are accessible by 2, 3 or 4-way inlet/outlet valves.

In still other embodiments, the trays may be fabricated with sidewalls that are only of sufficient dimensional extent as to allow mounting or fixation to the interior wall surface of the vaporizer vessel.

In further embodiments, the trays may be fabricated without sidewalls, and may be mounted in the interior volume with the aid of supports on the interior wall surface of the vessel, with circumferential sealing gaskets, or other mounting structure or elements. Additional embodiments are contemplated, in which the trays are mounted in vertically spaced-apart relationship to one another, as an assembly. For example, the trays can be mounted on a frame or other positioning structure, as a unitary array that is inserted into and withdrawn from the interior volume of the vessel, as desired, during the assembly and disassembly of the vaporizer.

In one specific embodiment, each of the trays has a circumscribing sidewall, and the height of each through-tube is less than the height of the tray sidewall, thereby providing a head space above the end of the through-tube for gas dispersion and circulation within the respective tray.

Alternatively, the through-tubes and trays can be configured to create fluidized beds in each of the trays, or the trays can be fabricated to with porous openings therein, so that solids or other source reagent material is initially supported on the top surface of the tray, with the carrier gas being flowed through the through-tubes or porous openings, at sufficient superficial velocity to fluidize the source reagent. For such purpose, the source reagent preferably is in a powder or other finely divided solid form, so that the pressure drop associated with the fluidization is not excessive. In such arrangement, the dimensions of the through-tubes or porous openings are sufficiently small as to retain the solids supported on the tray in the absence of fluidizing gas flow.

More generally, the through-tubes desirably have a height that provides a leak-proof region for placement of a sufficient quantity of source material, whether solid or liquid, to provide the required vaporized material without leakage of solids or liquid into the underlying container through the open passageways 32 of the through-tubes. In one embodiment, each through-tube extends vertically upwardly from the bottom of the tray to a height that can for example be in a range of from about 0.5 mm to about 5 mm, and more preferably in a range of from about 1.5 mm to about 3.0 mm.

As shown in FIG. 1, the positioning of the through-tubes in each tray is slightly offset from the positions of the through-tubes in an adjacent tray, thereby forcing the carrier gas to circulate within the tray for contact of the carrier gas with the vaporized source material before the resulting gas mixture is transported through the through-tubes into the next-adjacent tray region. By such arrangement, the multiple levels of contacting of the carrier gas with the source reagent material permits the carrier gas to become saturated in a highly efficient manner.

The size of the vaporizer delivery system 10 can be widely varied depending on the amount of the vapor to be supplied to the downstream fluid-utilizing installation, such as a CVD apparatus or ion implantation system. In one embodiment, the vaporizer has a cylindrical conformation with an inner diameter in a range of from about 3 to 6 inches, e.g., about 3.75 inches. The number of trays in the interior volume of the vaporizer vessel will be determined by the size of the vaporizer. In various embodiments, from three to five trays are enclosed in the vaporizer vessel.

The vaporizer containing a multiplicity of trays can be heated and kept at a desired temperature appropriate to the specific source material to be vaporized, the desired concentration of the source reagent in the carrier gas mixture that is delivered to the downstream fluid-utilizing facility from the vaporizer, and the specific set of operating conditions that is employed in the source reagent vaporization operation.

Heating of the vaporizer vessel can be conducted in any suitable manner. In one embodiment, a ribbon heater is wound around the vaporizer. In another embodiment, a block heater having a shape covering at least a major portion of the external surface of the vaporizer is employed to heat the vaporizer vessel. In still another embodiment, a heat transfer fluid at elevated temperature may be contacted with the exterior surface of the vaporizer vessel, to effect heating thereof. A further embodiment involves heating by infrared or other radiant energy being impinged on the vaporizer vessel.

The invention in a further embodiment contemplates heating of the source reagent by circulation of a hot gas in the vessel, to effect convective heating of the source reagent.

The method of heating of the vaporizer vessel is not particularly limited as long as the vaporizer is brought thereby to a desired temperature level and maintained that such temperature level in an accurate and reliable manner.

It is desirable to heat the vaporizer vessel in a thermally homogeneous fashion, so that temperature deviations in the interior volume of the vessel are minimized. In specific embodiments, in which the trays are in direct thermal contact with the wall, heating of such trays via thermal conduction from the wall affords a convenient and effective way to vaporize the source reagent on the trays.

It may be desirable in some applications to utilize added surface area structures in the interior volume of the vaporizer vessel, to enhance the extent and rate of heating of the source reagent material for vaporization thereof.

As another expedient for achieving high efficiency vaporization of the source material, the carrier gas may be heated prior to its introduction to the interior volume of the vaporizer vessel, to assist the heating of the source reagent and vaporization thereof. For example, the flow line supplying the carrier gas to the inlet valve 20 may be heat-traced, or otherwise subjected to heating, to effect delivery of the carrier gas to the vaporizer vessel at a desired temperature level.

In a specific arrangement for vapor delivery from sublimable solid source reagents, the vaporizer delivery system of the present invention utilizes a series of heated trays including a plurality of heated through-tubes that increase the heated surface area, thereby enabling sublimation of the solid source material to be achieved in a highly efficient manner as a result of the increased distribution of heat.

In some applications, it may be desirable for the vaporizer vessel to have a large thermal mass, in order to maintain a more consistent temperature during processing. The use of a large thermal mass can be particularly important in applications involving sublimation of a solid source material from the solid state to the vapor state. At a given temperature, the vapor pressure of a solid is the partial pressure of that material at the solid/gas interface, that is, there are as many molecules condensing on the solid surface as the number of molecules sublimating from the surface at a given time period. Equilibrium is destroyed if the molecules in the gaseous state are removed from the solid/gas interface by the carrier gas. Clearly, sublimation takes place at a higher rate to restore equilibrium, if there is enough heat supplied to the surface of the solid to compensate for the latent heat of sublimation of the solid. By providing a plurality of heated through-tubes on heated trays associated with heated vaporizer vessel walls, the entire heat-conductive container functions to increase the rate of sublimation, to produce an increased flow rate of saturated carrier gas and reduce the precipitation of vaporized source material that can clog the through-tubes or other pores or channels of the trays.

The specific temperature of the vaporizer that is employed in a given application will depend on the operating conditions of the downstream fluid-utilizing apparatus, e.g., CVD apparatus or ion implantation system, and the vapor pressure and the amount of the source material that is provided. In various specific embodiments in which sublimable solid source reagents are employed, vaporizer temperatures in a range of from about 40° C. to about 300° C. can be employed. Implementations of the present invention involving metal halide solid source reagents can for example utilize temperatures in a range of from 200° C. to 300° C., in specific embodiments.

The vaporizer delivery system of the present invention can in specific embodiments further comprise: lines for supplying a carrier gas to the vaporizer vessel; lines for discharging source reagent vapor from the vaporizer vessel; flow circuitry components such as flow control valves, mass flow controllers, regulators, restricted flow orifice elements, thermocouples, pressure transducers, monitoring and control devices, heaters for input of thermal energy to the vaporizer vessel and its contents, heaters for maintaining temperature in the carrier gas supply lines and source reagent vapor discharge lines, etc.

In some embodiments of the invention, heating of source reagent vapor discharge lines is conducted to maintain the temperature of such lines 5-10° C. hotter than the vaporization temperature in order to prevent condensation in such discharge lines.

In the use of vaporizer systems of the present invention, the source reagent material can be introduced into the vaporizer vessel, contained in the trays or otherwise disposed in the interior volume of the vaporizer vessel, prior to securing the cover to the vessel (see FIG. 1, wherein the cover 18 is secured by bolt mechanical fasteners to the vessel). The source reagent material may be in any suitable form, including solid form, liquid form, semi-solid form, or a solution containing the source reagent material dissolved or dispersed in a suitable solvent medium.

In one embodiment, the source reagent material is provided in the form of a deposit, coated on the surfaces of the trays and through-tubes within the tray cavity as a film or coating of suitable thickness. Such film or coating may be formed by any of various suitable methods, including the method of melting the source reagent by heating same, applying the molten source reagent material to the surfaces of the trays and through-tubes and then cooling the applied material.

In another embodiment, wherein the source reagent comprises a metal complex, the metal complex can be dissolved in a solvent and the resulting solution applied to the surfaces of the trays and through-tubes, followed by removal of the solvent from the applied material under reduced pressure.

In some embodiments, it may be desirable to concurrently supply different source reagent vapor species from the vaporizer vessel to a downstream fluid-utilizing installation. In such applications, different source reagent materials can be provided on different trays and/or in different cartridges in the vaporizer vessel interior volume. By such arrangement, it is possible to generate a multicomponent vapor that is carried by the carrier gas to the downstream facility.

The vaporizer thus can include a plurality of vertically stacked trays mounted on a central downtube in the interior volume of the vaporizer vessel. The source reagent material can be loaded into the interior volume of the vessel, by charging of the trays with predetermined amounts of the source reagent, e.g., a metered amount of particulate solids. After such loading of the source reagent in the vaporizer vessel, the top lid 18 of the vessel (see FIGS. 1 and 2) is positioned on the top of the vessel and sealed thereto, such as by an o-ring element fabricated of polytetrafluoroethylene or an elastomer, or by a metal seal element and/or by mechanical fasteners, such as bolt fasteners.

After assembly of the vaporizer, and coupling of the vaporizer vessel with process lines for delivery of carrier gas to the vessel, and discharge from the vessel of carrier gas mixture containing the source reagent vapor, the vaporizer heater is actuated to effect heating of the vaporizer vessel. The heating is conducted so that the internal temperature within the vaporizer and contacting trays is increased to a temperature sufficient to vaporize the source material.

In the case of a sublimable solid, the sublimation rate will be greatest on the first or lowest tray due to the pure carrier gas entering that tray, as opposed to the partially or fully saturated carrier gas entering the trays above it. As such, it may be necessary to load more source reagent material on the bottom tray and/or to increase the height dimension of the container to enable the desired amount of source reagent vapor to be generated and flowed to the downstream fluid-utilizing facility.

The vaporization system of the invention is advantageously employed for generating vapor from a wide variety of source reagent materials, and has particular utility for volatilization of sublimable solids such as decaborane, hafnium tetrachloride, and the like. The present invention has utility in various applications for volatilization of solid source materials, e.g., solid materials characterized by sublimation temperatures in a range of between about 20° C. to about 300° C. and having a vapor pressure in a range of from about $10^{-2}$ Torr to about $10^3$ Torr at its sublimation temperature.

Temperature may be controlled within the vaporizer by any heat regulating system including, without limitation, strip heaters, radiant heaters, heated enclosures, circulating fluid heaters, resistant heating systems, inductive heating systems, etc., as constructed and arranged for controlled temperature operation. Further, temperature within the vaporizer can be sensed by a thermocouple, thermistor, or any other suitable temperature sensing junction or device arranged for contacting a surface of the thermally conductive vessel and/or trays therein. Such temperature sensing device can be operatively coupled with a central processing unit, such as a general-purpose programmable computer, programmable logic unit, microcontroller, etc., as arrange to receive temperature sensing signals from the temperature sensing device, and to responsively modulate the heater, and/or other controllable elements of the vaporizer system, to achieve a desired production of source reagent vapor for the specific application involved.

To determine when the vaporizer is depleted of source material, a level sensor monitoring system can be employed to determine the amount of solid or liquid in a top tray and/or in a bottom tray in the interior volume of the vaporizer vessel, such as an optical sensor communicatively connected to a reflective surface on the bottom surface of a tray to provide a change in signal when the tray is near empty or empty.

Figure 4:
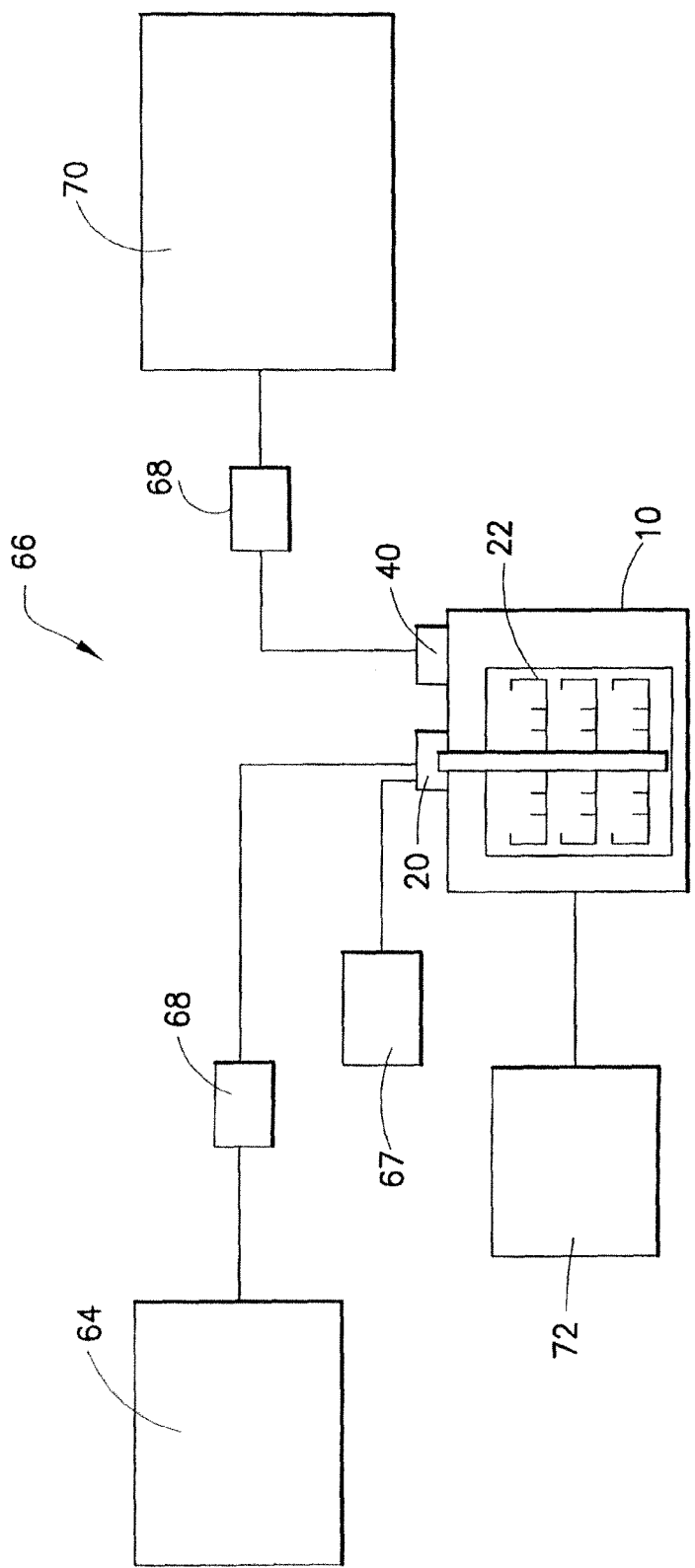
FIG. 4 is a simplified schematic representation of a vapor delivery system configuration usefully employed in various embodiments of the present invention.

FIG. 4 is a simplified schematic representation of a vapor delivery system 66 configuration usefully employed in various embodiments of the present invention.

This system includes a vaporizer 10. A carrier gas source 64 is connected to the vaporizer 10 to provide carrier gas. In alternative modes of introducing a source material, a liquid source material may be introduced into the vaporizer from a liquid source container 67, or the vaporizer 10 can otherwise be pre-filled with a solid source reagent in a granular or particulate form.

The flow rate of the carrier gas may be monitored and controlled by flow meters 68 disposed in the carrier gas delivery line and in the line transporting the vaporized source material to the processing chamber 70. The gas delivery lines in one specific embodiment are fabricated of a material having a low coefficient of friction, such as a polymer, to enable high flow velocities to be achieved. The vaporizer 10 advantageously is fabricated of a thermally conductive material that enables transmission of thermal energy generated by at least one heater 72 communicatively connected to the vaporizer unit 10 for heating of the vaporizer vessel and contents thereof.

For the purpose of monitoring and control of the vaporized source reagent and carrier gas with which the vaporized source regent is mixed and flowed to the deposition chamber or other downstream process unit, in one embodiment of the invention, a thermopile infrared detector monitoring system of the type described in U.S. Pat. No. 6,821,795, issued Nov. 23, 2004, U.S. Pat. No. 7,011,614, issued Mar. 14, 2006, or U.S. Pat. No. 6,617,175, issued Sep. 9, 2003, can be used, with a blender system of the type described in U.S. Pat. No. 6,909,973 issued Jun. 21, 2005, U.S. Pat. No. 7,058,519 issued Jun. 6, 2006, or U.S. Pat. No. 7,063,097 issued Jun. 20, 2006. Such thermopile infrared detector monitoring system and blender system can for example be deployed in a bypass line in the flow circuitry of the process system including the vaporizer and reagent source.

The amount of power required for complete vaporization is a function of the chemistry of the source material and carrier gas, and the flow rate of the mixture. In a specific embodiment, the thermal power transferred to the vaporizer can be in a range of from about 100 W to about 3000 W to provide highly efficient isothermal temperatures for the source reagent vaporization.

In operation of the vaporizer system of the type shown in FIG. 4, when a solid source reagent material is employed, the source reagent material can be loaded into the trays in a dry box or glove box, to eliminate the reaction of the precursor with oxygen and moisture while the vaporization vessel is open. The vessel in the dry box or glove box then is loaded with the source reagent-containing trays, and the lid is applied and secured in position, to yield the closed vaporization vessel. The vessel then is coupled with the feed and discharge lines for carrier gas ingress and vapor-containing carrier gas mixture discharge, in the process system.

A carrier gas from the gas source 64 then is introduced into the vaporizer in carrier gas inlet 20, e.g., at a gas flow rate in a range of from 1 standard cubic centimeters per minute (sccm) to about 500 sccm. The carrier gas is transported into the vaporizer at an appropriate pressure to provide a steady flow of carrier gas that is introduced into the vaporizer vessel and flows from the lower portion of the vessel, where it is introduced, outwardly and upwardly through the interior volume, through the successive trays and through-tubes thereof.

As the carrier gas flows upwardly through the different levels of the vertically stacked trays, the carrier gas becomes saturated with vaporized source reagent material. The resulting carrier gas mixture containing the source reagent vapor then flows out of the vaporizer at gas outlet valve 40 to the process chamber 70. The process chamber 70 can be of any simple type in which the dispensed source reagent vapor-containing carrier gas mixture is processed or utilized. In one specific embodiment, the process chamber 70 comprises an atomic layer deposition chamber or an ion implantation chamber.

A preferred vaporizer usefully employed in the practice of the present invention, of a type as described in connection with FIGS. 1-3 hereof, is commercially available from ATMI, Inc., Danbury, Conn. USA under the trademark ProE-Vap®. The ProE-Vap vaporizer utilizes stacked trays containing the source reagent. In such vaporizer, the carrier gas is introduced from the top end and flows through a downwardly extending feed tube to a bottom portion of the vessel for subsequent distribution and upward flow through each tray in the interior volume of the vessel. In such manner, the vessel, when heated, conductively heats the trays in the vessel interior volume, to produce vapor deriving from the source reagent on the trays. The generated vapor then is entrained in the carrier gas. The resulting carrier gas mixture including the source reagent vapor then is discharged from the vaporizer at the top end thereof through an output port of the vessel. From the outlet port, the carrier gas mixture containing the source reagent vapor passes to the discharge valve of the vaporizer. The discharge valve can be coupled to flow circuitry associated with a downstream processing unit, e.g., a chemical vapor deposition chamber, ALD chamber, or ion implanter, for flow of the carrier gas mixture containing the source reagent vapor, from the vaporizer vessel to such downstream fluid-processing facility.

Other vaporizers can be utilized in the practice of the present invention, including the vaporizer described in European Patent Application 1508631 published Feb. 23, 2005 for "Method and Apparatus for the Delivery of Precursor Materials," the disclosure of which hereby is incorporated herein by reference. This published patent application describes a vaporizer vessel in which at least one protrusion extends into a lower portion of the volume of the vessel and contacts the precursor, with the at least one protrusion extending from the lid, sidewall and/or base of the vessel. The vessel may have inlet and outlet ports in the lid, communicating with flow circuitry and arranged for flowing carrier gas through the interior volume of the vessel for contacting vapor of the heated precursor. The protrusions therefore serve as extended area heat transfer elements, to facilitate volatilization of the precursor, and flow distribution of the carrier gas, within the vessel.

Another illustrative vaporizer that may be utilized in the broad practice of the present invention is described in US Patent Application Publication 2006/0024439 published Feb. 2, 2006 for "System for Controlling the Sublimation of Reactants," the disclosure of which also is hereby incorporated herein by reference. The vaporizer described in such reference includes a heat conductive vessel for volatilizing precursor from a mixture of precursor and thermally conductive material. The thermally conductive material may be present in the form of rods, powder, screens, sieves, coils, plates, etc.

Other vaporizers that may be utilized in the broad practice of the present invention are described in U.S. Pat. No. 6,921,062 issued Jul. 26, 2005 for "Vaporizer Delivery Ampoule," the disclosure of which also is incorporated herein by reference. The vapor is described in this patent includes vertically stacked containers such as trays, having vapor flow conduits through the floors of such containers to accommodate flow of reagent vapor through the interior volume to an outlet port of the vessel. The vessel may be equipped with a carrier gas tube to introduce carrier gas into the interior volume of the vessel, and the vapor flow conduit channels permit the carrier gas to contact solid in the stacked containers, e.g., source reagent solid on the surface of each of a vertical stack of trays.

The present invention in various specific aspects relates to vaporizer systems for generating and delivering source reagent vapor from solid or liquid source reagents, wherein the source reagents are susceptible to particle generation and the presence of the particles in the vapor deriving from such source reagents. The invention has particular utility in application to solid source reagents that are susceptible to particle generation and the presence of particles in the corresponding vapor.

Solids precursors with which the vaporizer systems of the invention are usefully employed can be of any suitable type, including solid-phase metal halides, organometallic solids, and the like. Examples of source reagents that may be utilized in the practice of the present invention include, without limitation, dimethyl hydrazine, trimethyl aluminum (TMA), hafnium chloride ($HfCl_4$), zirconium chloride ($ZrCl_4$), indium trichloride, aluminum trichloride, titanium iodide, tungsten carbonyl, $Ba(DPM)_2$, bis di pivaloyl methanato strontium ($Sr(DPM)_2$), $TiO(DPM)_2$, tetra di pivaloyl methanato zirconium ($Zr(DPM)_4$), decaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide ($Zr$ ($t$-$OBu)_4$), tetrakisdiethylaminozirconium ($Zr(Net_2)_4$), tetrakisdiethylaminohafnium ($Hf(Net_2)_4$), tetrakis(dimethylamino)titanium (TDMAT), tertbutyliminotris(deithylamino)tantalum (TBTDET), pentakis(demethylamino)tantalum (PDMAT), pentakis(ethylmethylamino)tantalum (PEMAT), tetrakisdimethylaminozirconium ($Zr(NMe_2)_4$), hafniumtertiarybutoxide ($Hf(tOBu)_4$), xenon difluoride ($XeF_2$), xenon tetrafluoride ($XeF_4$), xenon hexafluoride ($XeF_6$), and compatible combinations and mixtures of two or more of the foregoing.

As an illustrative example selected from among the foregoing materials, hafnium chloride is a source reagent that is utilized to achieve deposition of hafnium and hafnium-containing films in semiconductor manufacturing operations. Hafnium chloride is a solid source reagent material that has been found to be highly susceptible to generation of particulates and the presence of particles in the vapor generated from the hafnium chloride solid.

The invention contemplates various approaches, apparatus configurations and techniques for resolving the particulate problems associated with source reagent materials susceptible to particle generation, including source reagent materials in the form of powdered solids that are volatilized to provide source reagent vapor.

While these approaches, configurations and techniques are described hereinafter in specific reference to powdered solids source reagents, such as hafnium chloride powder, it will be recognized that the applicability thereof in many cases also extends to and encompasses the use of various liquid source reagent materials.

As broadly considered in application to the use of powdered solids source reagents, the approaches, configurations and techniques of the invention include, without limitation:

(i) sifting of powdered source reagents prior to use thereof, in order to achieve a specific particle size range and distribution for the precursor solid material;

(ii) selection of particle size, composition and morphology that is most favorable in minimizing the presence and extent of particle generation when the source reagent is volatilized;

(iii) bypassing the primary path of the flow circuitry coupled with the vaporizer, with a bypass path containing a trap or filter to remove particles from the source reagent vapor;

(iv) aggregating particles of the solid source reagent with heat prior to contacting of carrier gas therewith, e.g., effecting melting or coalescence of source reagent solid particles so that fines are removed by consolidation with other particles and do not pass into the vapor generated from the solid source reagent;

(v) sublimation of a solid source reagent onto trays or wall or support surfaces in the vaporizer vessel;

(vi) sublimation of a solid source reagent onto beads or frit elements for introduction to the interior volume of the vaporizer vessel;

(vii) use of a diffuser or flow spreader to disperse incoming carrier gas at the point of introduction of same to the interior volume of the vaporizer vessel;

(viii) use of porous solid source reagent bodies, such as are formable by mixing polymer or other fugitive medium with a powder of the solid source reagent material, and subsequently removing the polymer media or other fugitive medium, to yield a porous solid source reagent body;

(ix) electrostatic capture of particles of source reagent material from the source reagent vapor or carrier gas mixture containing same;

(x) control of flow of the carrier gas at initial start-up of the vaporizer, e.g., by use of a supplemental flow control valve, to dampen or eliminate the surge of carrier gas flow incident to opening of the inlet valve of the vaporizer;

(xi) equalizing pressure in the vaporizer vessel and downstream tool or other fluid-utilizing facility, to dampen or eliminate the surge of carrier gas flow incident to opening of the inlet valve of the vaporizer, e.g., utilizing backward flow initially so that the gas throughout the vaporizer flow path from the vaporizer and associated flow circuitry to the downstream fluid-utilizing facility is at a substantially same pressure level;

(xii) utilizing a gate overflow valve to minimize high flow conditions, so that pressure rise incident to opening the inlet valve of the vaporizer is maintained below a predetermined maximum value;

(xiii) providing a top tray or other source reagent support structure in the upper portion of the interior volume of the vaporizer that contains no source reagent, so that such "empty" portion of the interior volume functions to provide disengagement of particles from the carrier gas mixture at such portion of the interior volume;

(xiv) use of a filter in an upper portion of the vaporizer vessel, above the source reagent support structure therein;

(xv) use of multiple filters of different sizes in series for particulate removal;

(xvi) use of a conical filter on the inlet of the vaporizer;

(xvii) creation of a vortex at the outlet region of the interior volume of the vaporizer, to capture particles from the carrier gas mixture and prevent them from being discharged;

(xviii) use of a filter on the vaporizer outlet, e.g., incorporated into the lid of the vessel;

(xix) use of vortex and electrostatic techniques in combination with one another to effect particulate removal from the carrier gas mixture;

(xx) use of course particle filter media, combined with screen or other retention structure(s), to hold source reagent material in place on the trays or other support structure in the vaporizer;

(xxi) use of ionic liquid as a medium for storage of the source reagent, e.g., involving dissolution of the source reagent into the ionic liquid, and use of the vaporizer to hold the resulting ionic liquid solution containing the source reagent therein;

(xxii) control of the sublimation process to control particle size generation in the vapor deriving from the source reagent material, e.g., by controlled heating of the vaporizer vessel, optionally involving temperature monitoring or monitoring of other process variables, and the use of the monitoring information to modulate the heating of the vessel; and (xxiii) provision of structure modulating any Joule-Thompson effects resulting from expansion-mediated cooling of the carrier gas mixture containing the source reagent vapor.

Various embodiments of the invention will now be described, illustrative of some of the foregoing approaches for minimizing or suppressing the presence of source reagent solids particles in the vapor deriving from the source reagent material.

Figure 5:
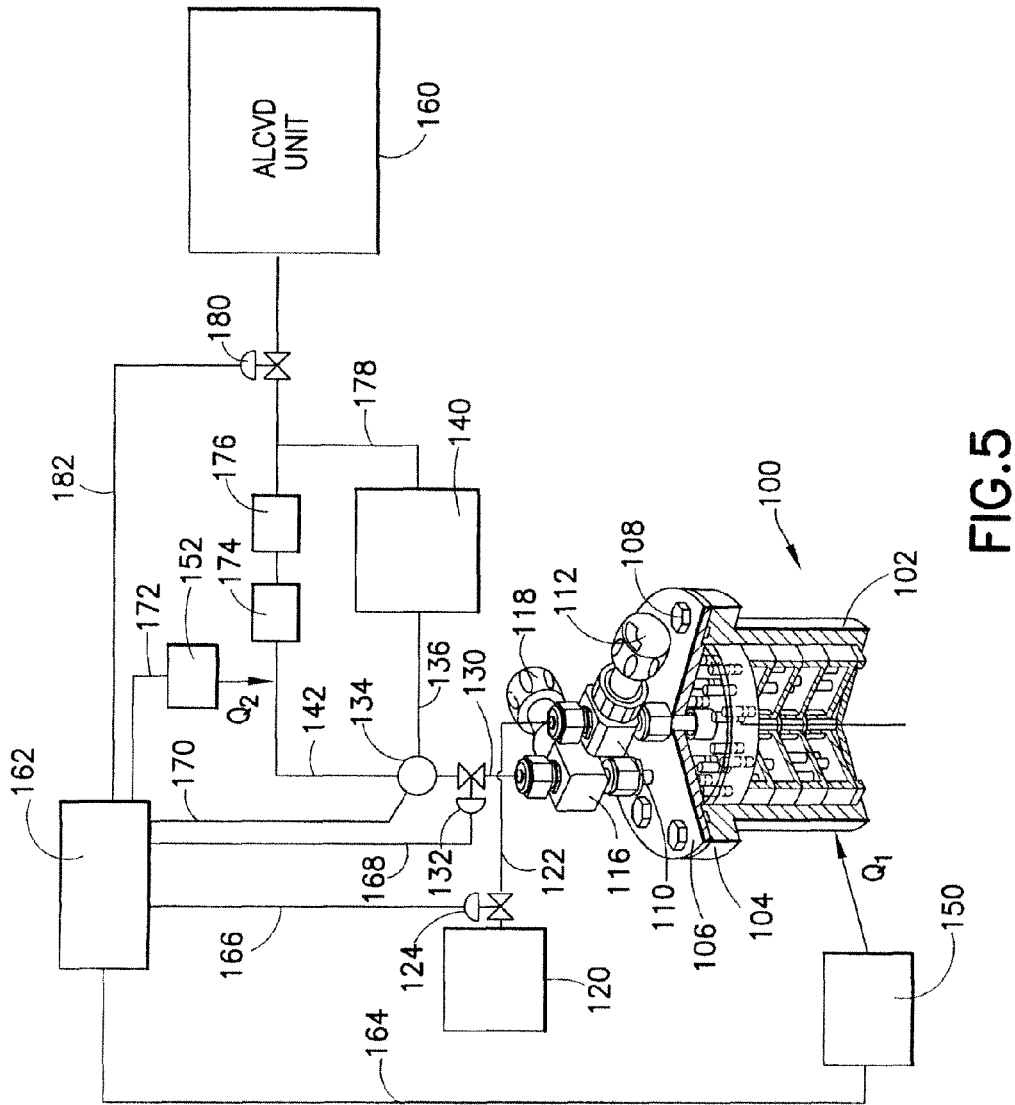
FIG. 5 is a schematic representation of a semiconductor manufacturing facility, utilizing a vaporizer in accordance with one embodiment of the present invention.

Referring again to the drawings, FIG. 5 is a schematic representation of a semiconductor manufacturing facility, utilizing a vaporizer 100 in accordance with one embodiment of the present invention.

The vaporizer 100 includes a vessel 102 fabricated of metal or other heat-conducting material, in which the side wall of the vessel terminates at an upper end in a radially outwardly extending flange 104. A cover 106 is positioned on the flange 104 and secured by mechanical bolt fasteners 108. Mounted on the cover are inlet and outlet valves. The inlet valve 110 is equipped with a hand wheel 112, for translation of the valve element in the interior of the valve body, between a fully opened and a fully closed position. The inlet valve 110 alternatively can be an automatically actuatable type valve, coupleable with a pneumatic, electrical or other automatic valve actuator.

The inlet valve 110 is coupled with a downtube, as illustrated, to convey carrier gas into a lower portion of the vessel for flow outwardly and upwardly in the interior volume of such vessel. The vaporizer also includes an outlet valve 116 including a hand wheel 118 for adjusting the flow rate of carrier gas mixture containing volatilized material deriving from the solid source reagent in the vessel 102. The valve 116 includes a valve element that is selectively actuatable by the hand wheel 118, for translation between a fully open and a fully closed position. As in the case of the inlet valve, the outlet valve 116 can be an automatically actuatable type, coupleable with a pneumatic, electrical or other automatic valve actuator.

In the vessel 102 is mounted a series of trays or other added surface elements providing support for the solid source reagent therein. The trays in the illustrated embodiment are provided with an array of tubes extending through the tray, for passage of fluid therethrough. The tubes in vertically adjacent trays are off-set in relation to one another, so that the carrier gas flows along an extended path, i.e., a tortuous path, to maximize entrainment by the carrier gas of the vapor deriving from the source reagent material.

The source reagent material itself may be provided in any appropriate form, such as granules, pellets, porous solid bodies, etc., whereby the contacting of the carrier gas fluid with the solid results in entrainment of vapor from the solid. The vessel 102 is heated by a heater 150, which as schematically shown, introduces a heat flux $Q_1$ to the vessel.

The inlet valve 110 of the vaporizer is coupled to a feed line 122 having flow control valve 124 therein. The feed line is coupled at an opposite end from the inlet valve, to a source 120 of carrier gas. The flow control valve 124 may be manually operated, or it may as illustrated be coupled via signal transmission line 166 to the central processing unit 162.

The central processing unit may comprise a general purpose programmable computer, microprocessor, logic device, programmable logic controller, or the like, as adapted to provide a control signal transmitted in line 166 for opening or closing of valve 124 to a desired extent accommodating flow of carrier gas from source 120 through feed line 122 to the vaporizer 100.

The outlet valve 116 of the vaporizer is joined by discharge line 130 having flow control valve 132 therein, to a three-way valve 134 by which flow from discharge line 130 can be selectively flowed to one of lines 136 and 142.

In a first position, the valve 134 couples discharge line 130 with bypass line 136. Line 136 in turn is coupled with solids removal unit 140, which functions to remove particulate solids from the carrier gas mixture containing the source reagent vapor, to discharge a solids-depleted stream in discharge line 178.

The solids removal unit 140 may comprise a filter, cyclone, solids precipitator such as an electrostatic precipitator, screen, mesh, or other solids retention or row mobile element serving to reduce the solids content of the fluid introduced from line 136, so that the vapor-containing fluid stream discharged from the solids removal unit in line 178 is depleted in solids content to a desired extent, preferably being substantially completely free of a particulate solids therein.

The three-way valve 134 in a second position couples discharge line 130 with feed line 142 in which fluid is passed to the atomic layer deposition (ALD) unit 160, for use in the atomic layer deposition operation carried out in such unit.

The feed line 142 as illustrated contains filters 174 and 176 in series with one another, to ensure particle removal from the fluid stream being sent to the ALD unit. The filters 174 and 176 may be utilized in combination with the solids removal unit 140 to achieve a predetermined low solids level in the fluid stream passed to the ALD unit, or alternatively only one of such filters 174 and 176 may be disposed in feed line 142.

The feed line 142 is schematically shown as associated with heater 152 which delivers a heat input $Q_2$ to the feed line. The heater 152 is coupled via a signal transmission line 172 to the CPU 162, by which the heater may be actuated, or selectively modulated to provide a desired heat input to the feed line and fluid flowing therein. Alternatively, in lieu of a dedicated heater unit, the feed line 142 may be heat-traced, or contain a heating element for electrical resistance heating, or in other manner be arranged for heat input to maintain a predetermined temperature of the fluid flowed to the ALD unit.

The three-way valve 134 may be controlled by the CPU 162 via signal transmission line 170. The CPU 162 also is joined via signal transmission line 168 to valve 132 in discharge line 130, whereby the valve 132 can be selectively opened or closed to a desired extent, for delivery of source reagent vapor-containing fluid at a desired discharge flow rate.

The feed line 142 upstream of the ALD unit 160 contains a flow control valve 180 that is coupled via signal transmission line 182 to the CPU 162.

By the illustrated arrangement, the CPU functions as a control system for the process installation, to modulate flows of respective components, outputs of heaters, and additionally other instrumentation and control elements (not shown) that may usefully be deployed in the installation.

In operation, the vaporizer 100 is heated by heater 150 to a desired degree to generate vapor from the source reagent solids on the trays in vessel 102. Carrier gas from source 120 is flowed in line 122 into the interior volume of vessel 102 and flows outwardly and upwardly for contact with solids therein.

As a result, the carrier gas entrains vapor driving from the solids and the resulting fluid stream flows in discharge line 130 into feed line 142 and/or line 136 as required to effect a desired level of solids reduction in the fluid stream. The resulting solids-depleted stream flows into ALD unit 160 and is utilized therein for deposition of a component deriving from the source reagent on a substrate in the ALD chamber in such unit (not shown). The ALD unit thus may be operated at high efficiency as regards the reject rate of wafers processed therein, owing to the solids reduction achieved by the vapor delivery system as described.

Figure 6:
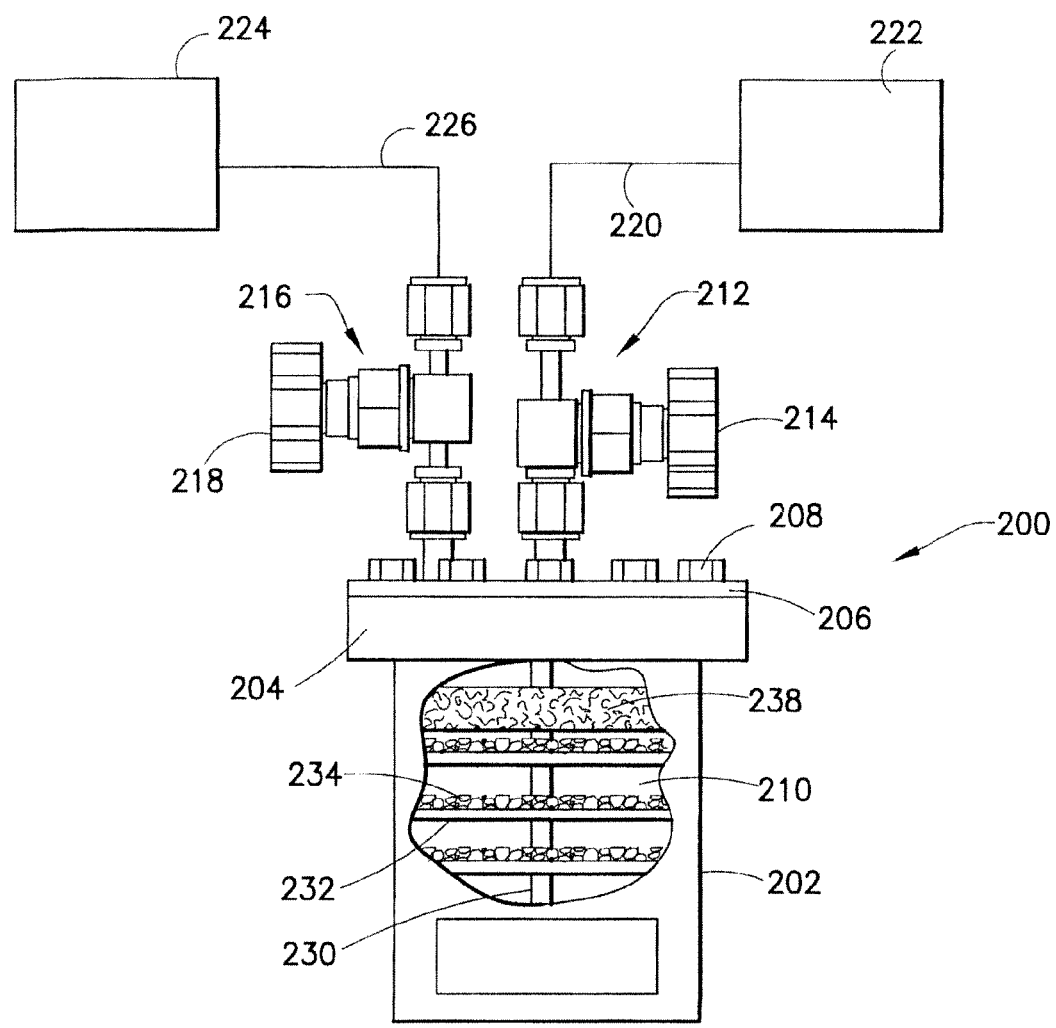
FIG. 6 is a schematic representation of a vapor generation and utilization system including a vaporizer according to another embodiment of the invention.

FIG. 6 is a schematic representation of a vapor generation and utilization system including a vaporizer 200 according to another embodiment of the invention.

The vaporizer 200 includes a vessel 202 which together with lid 206 secured to upper flange portion 204 of the vessel encloses an interior volume 210. In the interior volume is mounted a series of support plates 232 which as shown are vertically spaced apart from one another, and which are penetrated in a central portion thereof by a downwardly extending tube 230. The upper end of the tube 230 is coupled with feed valve 212 including hand wheel 214. The feed valve 212 is joined by line 220 to source 222 of carrier gas that is introduced into the vessel for entrainment of source reagent vapor deriving from solids 234 supported on the plates 232. The solids 234 may be in particulate, granular, or other discontinuous form, as appropriate to the specific application involved. A vessel of the vaporizer may be heated in any suitable manner, by a heater, thermal jacket, or other heating device or arrangement (not shown).

Disposed at an upper portion of the interior volume 210 is a disc-like filter 238 that is generally co-extensive in areal extent with the cross sectional area of the interior volume, so that the carrier gas/source reagent vapor mixture flowing upwardly through the vessel passes through the filter 238 for solids removal, prior to entering the exit flow passage (outlet port) of the vessel for flow to the discharge valve 216. The outlet port may be constituted by an opening in cover 206, with an inlet of the discharge valve 216 disposed in such opening. The discharge valve 216 includes hand wheel 218 and is joined to feed line 226, by which the fluid discharged from the vaporizer is flowed to fluid use facility 224, which may be a chemical vapor deposition chamber, an ion implant unit, or other fluid-utilizing apparatus or region.

Each of the support plates 232 in the interior volume 210 of vessel 202 has solids 234 thereon, for contacting with the carrier gas introduced into the interior volume of the vessel.

The carrier gas is supplied from carrier gas source 222 and flows in feed line 220 through inlet valve 212 to the downtube 230 for discharge in the lower portion of vessel 202. The thus-discharged fluid flows in the interior volume outwardly and upwardly, passing through pores or openings in the various plates 232, for entrainment of vapor deriving from the source reagent powder or other solid material on the plate.

For such purpose, the carrier gas from source 222 may be heated to elevated temperature, to facilitate the volatilization of the source reagent solid material in the vessel 202, in addition to heat being introduced into the vessel by a heating jacket, embedded resistance wires, or other heater or heating element(s) effective to introduce heat to the solids in the vessel via conduction. To effectuate such conductive heat transfer, the plates 232 may extend to and contact the wall of the vessel 202 circumscribing the interior volume.

The filter 238 may be formed of a fibrous material or bat of felt, matting, or other material. Preferably the filter has sufficient permeability so as to avoid an undue pressure drop during passage of the fluid therethrough to the discharge port associated with discharge valve 216 of the vessel.

In lieu of the filter 238, the discharge port of the vessel associated with discharge valve 216 may include a frit, screen, or other solids retention element in the port or in the valve passage(s) or in a line downstream from the discharge valve, such as line 226.

The trays in FIG. 6 are shown as having solids 234 in particulate form thereon, but it will be recognized that the solid may be provided on the support plates 232 as a deposited film, coating, or the like, whereby upon heating of the plate, the source reagent solid vaporizes to form the source reagent vapor component that enters the carrier gas stream to form the carrier gas mixture that is discharged from the vaporizer vessel.

As a further alternative, the solids 234 on the support plates 232 may be inert particles on which the source reagent material has been deposited, or coated, i.e., such that the inert particles act as a substrate for the coating of source reagent material. By this arrangement, the source reagent material can be readily volatilized from the substrate particles, to enter the vapor phase and be entrained in the carrier gas flowed through the vessel.

A filter element (not shown) may also be deployed on the inlet of the vaporizer, so that gas introduced from source 222 passes therethrough. In such manner, any solids content of the source material is prevented from posing a problem, e.g., by aggregation with solids that may be generated deriving from the source reagent material in the vessel.

When the source reagent material is provided in the first instance, it may be sifted or sieved to achieve a specific particle size range and distribution for the source material, as best suited to the specific vaporization operation involved.

Figure 7:
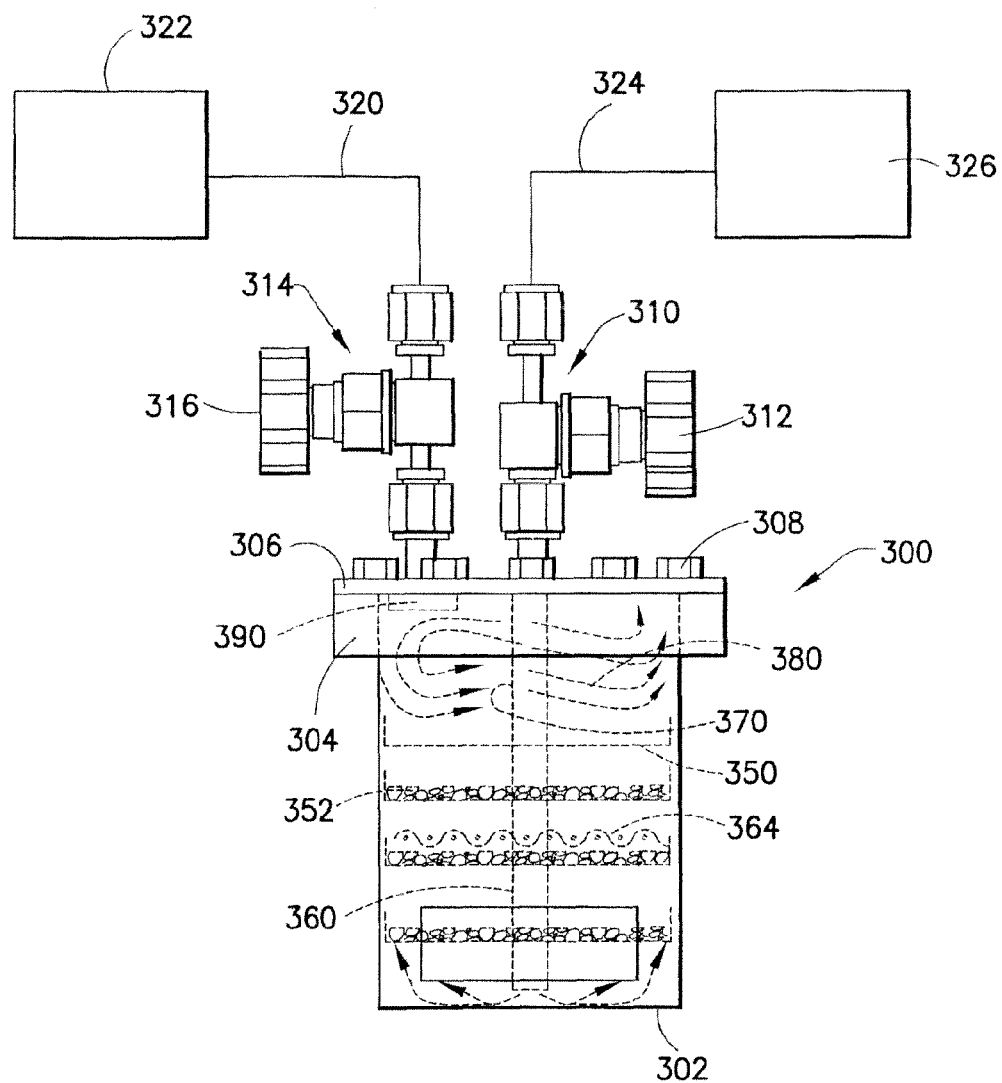
FIG. 7 is a schematic representation of a solid source vapor delivery system according to yet another embodiment of the invention.
Figure 8:
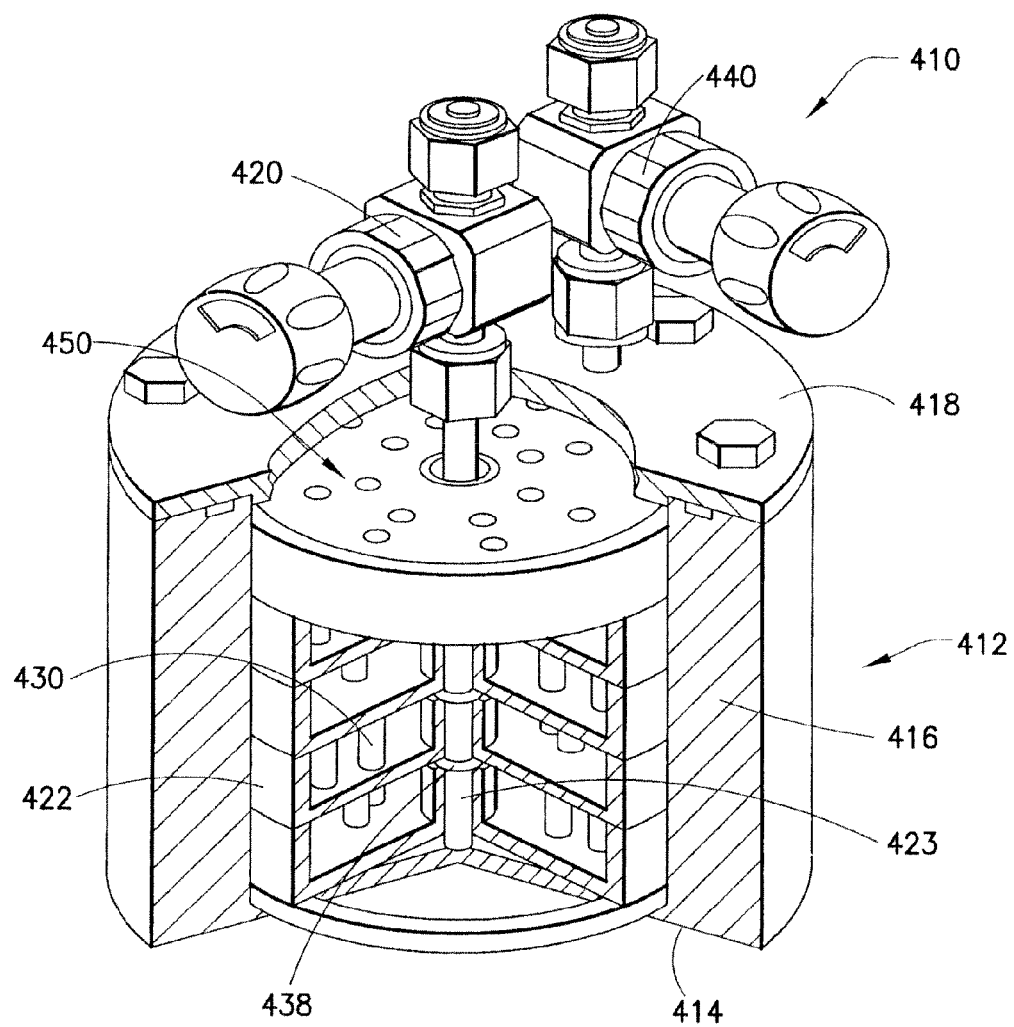
FIG. 8 is a perspective view, in partial section, of a vaporizer vessel according to another embodiment of the invention, utilizing a porous metal body as a support for a volatilizable solid.

FIG. 7 is a schematic representation of a solid source vapor delivery system according to another embodiment of the invention, comprising vaporizer 300 including a vessel 302 having an upper radially- and circumferentially-extending flange 304 to which is bolted by mechanical bold fasteners 308 a lid 306.

In such manner, the lid and associated vessel 302 enclose an interior volume, in which is disposed a series of vertically spaced-apart trays 350, which may be perforate or foraminous in character, to accommodate upward gas flow therethrough. The trays may be provided with particulate solid 352 thereon, as illustrated, and to restrain solids entrainment into the carrier gas, the tray may be overlaid by a screen 364 as illustrated for one of the trays in the vessel shown in FIG. 7.

In a variation of such solids retention structure, the screen 364 may be combined with a filter 238 of the type shown in the upper portion of the interior volume in the vaporizer of FIG. 6, so that the filter is overlaid by the screen, to ensure that solids are not fluidized in the carrier gas stream flowed through the vessel.

As illustrated in FIG. 7, the vaporizer 300 is supplied with carrier gas from a source 326, as flowed from the source in feed line 324 to the inlet valve 310 including hand wheel 312. The inlet valve 310 is coupled with a downtube 360 which is open at its lower end, to allow gas to flow outwardly at the floor of the vessel and upwardly through the respective trays to the upper portion of the vessel.

In the embodiment illustrated in FIG. 7, the upper tray 350 has no solids thereon, and therefore serves as a disengagement space for any solids that may have entered the fluid stream deriving from solid on trays below the empty tray.

In this embodiment, the downtube 360 is provided at an upper portion thereof with a series of tangential openings 370 that direct the gas in a tangential manner as evidenced by the flow lines 380 so that a vortexial flow of gas is generated, to effect solids disengagement from the gas flowing upwardly to the vessel port joined to discharge valve 314.

The discharge valve 314 is equipped with hand wheel 316 to open or close the valve element to a desired extent, for flow of carrier gas mixture containing the vaporized source reagent, through discharge line 320 to fluid-utilization facility 322. The fluid-utilization facility 322 may be a semiconductor manufacturing installation or other semiconductor manufacturing tool or fluid exposure chamber, as appropriate to the specific application involving the vapor deriving from the source reagent in the vessel.

In the FIG. 7 embodiment, the outlet port of the vessel communicating in gas flow communication with discharge valve 314 is shielded by a filter 390 disposed at the discharge opening in lid 306 to which is joined the inlet passage for discharge valve 314. The filter 390 serves to remove any fine solids particulates from the fluid stream being discharged from the vessel.

It will therefore be appreciated that a wide variety of solids removal devices, structures and techniques may be utilized in the broad practice of the present invention, to ensure reduction of fine particles and solids generally, so that same are substantially completely removed, or are at least largely reduced in the source reagent vapor-containing stream that is discharged from the vaporizer.

In addition to the foregoing solids removal devices, structures and techniques, the generation of fines and entrainment of same in the carrier gas may be significantly reduced by providing the solid source reagent in a porous monolithic form in the vessel, for contacting with the carrier gas.

For such purpose, the source reagent may be mixed with a polymer, binder or matrix material, following which the polymer, binder or matrix material is removed to leave the source reagent as a unitary body characterized by significant porosity.

As a specific example, hafnium chloride may be mixed with a polymer that is soluble in a polar solvent, following which the polymer may be leached from the composite source reagent/polymer body by the polar solvent, to yield a porous body of hafnium chloride, with which a carrier gas, e.g. argon, helium, or the like, can be contacted to deliver hafnium chloride vapor to a chemical vapor deposition chamber or other end-use facility.

As another variation, the source reagent may be mixed with or poured into a highly porous structure to constitute a composite monolith that can be heated to liberate vapor of the source reagent. Thus, a monolithic body may be employed as a substrate that is impregnated with the source reagent. For example, the source reagent may be dissolved in a solvent or suspending medium, which then is contacted with the monolithic body to impregnate same with the dissolved or suspended source reagent, following which the solvent is removed by drying or heating, to yield the monolithic body containing the source reagent.

It will be appreciated that the monolithic body in the foregoing embodiments can be of any suitable geometric shape and size appropriate to the vapor supply requirements of the system in which the source reagent-bearing monolithic body is deployed.

In another specific technique for reducing the generation of fines and presence of same in the source reagent vapor-containing stream discharged from the vaporizer, the source reagent particles in the first instance may be heated under mild elevated temperature conditions, to effect melting or coalescence of the smallest particles, in order to consolidate them with one another and/or with larger particles, and thereby reduce particle generation in the discharged fluid from the vaporizer.

In another embodiment, the downtube utilized to introduce carrier gas in the interior volume of the vaporizer may be provided at its lower end with a diffuser, showerhead or other flow distributor or dispersal element, so that the carrier gas is spread over the full cross-section of the vaporizer, for upward flow therethrough.

In another aspect, the vaporizer may be supplied with carrier gas involving flow through a carrier gas feed line containing a flow-limiting valve, to suppress or damp an initial pressure surge associated with introduction of carrier gas to the vessel in the first instance, as the feed valve in the carrier gas feed line is initially opened.

In another approach, the line pressure between the vessel and the downstream tool can be brought up to a level that equalizes pressure of the carrier gas, before the vaporizer inlet valve is fully opened, as a further technique to dampen any pressure surge incident to initial opening of the inlet valve to introduce carrier gas into the interior volume of the vaporizer.

A backward flow of carrier gas through the discharge line from the vaporizer may also be utilized to dampen any pressure surge at initial start-up of the vaporizer. A gate overflow valve in the carrier gas feed line may be used to limit high flow conditions, for the same purpose.

In some instances, Joule-Thompson effects may result in cooling of the fluid stream containing the source reagent vapor, whereby particles may form in the fluid stream resulting from the expansion-mediated cooling, and such effects can be prevented by appropriate design to minimize Joule-Thompson effects. For example, restricted flow orifice (RFO) elements may be utilized in flow lines or ports of the vaporizer system, to restrain Joule-Thompson expansion effects. FIG. 8 is a perspective view, in partial section, of a vaporizer vessel 410 according to another embodiment of the invention, utilizing a porous metal body 450 as a support for a volatilizable solid.

The vessel 410 other than the presence of the porous metal body 450 corresponds to the vessel 10 in FIG. 1 and is correspondingly numbered by reference numerals in FIG. 8 that are increased by addition of 400 to the number of the corresponding parts and elements in FIG. 1. Accordingly, the description of the FIG. 1 embodiment is apposite to the FIG. 8 embodiment, except with respect to the porous metal body 450 appearing in the FIG. 8 embodiment, which is now described.

The porous metal body 450 in the FIG. 8 embodiment is a metal foam material that is formed of a suitable metal such as aluminum or stainless steel, and is disposed in the upper tray of the vessel, as illustrated, to keep the source reagent evenly distributed in the tray even if the vessel is tipped during shipment or handling.

The foam, being a porous solid structural body, can also enable a substantially increased surface area to be provided, in relation to a planar tray surface, with the specific magnitude of increase in surface area depending on the porosity and pore size characteristics of the foam. The foam also enables greater metal to chemistry contact to be achieved, in relation to a tray structure alone. This in turn enables more uniform heating of the chemistry itself to be realized, when heat is inputted to the vessel.

The foam may in fact be usefully employed alone, as a monolithic body, or bed of monolithic articles, that can be deployed in the interior volume of the vaporizer vessel, in place of a tray assembly or other support structure.

Although the vessel illustrated in FIG. 8 has a foam body only on the uppermost tray, it will be appreciated that the vessel can alternatively be constructed with discrete foam bodies on each of the trays in the vessel, or as a still further variation, foam bodies may be employed on only several, but not all of the trays. In a particular embodiment, it may be advantageous to leave a top tray devoid of any solid thereon, as well as devoid of any foam body thereon.

The invention therefore contemplates the provision of a vaporizer including a vaporizer vessel adapted to hold a source reagent for contacting with a carrier gas introduced into the vessel for said contacting. The vaporizer is adapted for heating of the vaporizer vessel and the source reagent therein, to generate vapor deriving from said source reagent, wherein said source reagent is susceptible to generation or presence of particles in said vapor. The vessel defines an interior volume, with a cover securable to the vessel to enclose the interior volume. The cover includes inlet and outlet ports, whereby the carrier gas is introduceable to said interior volume through the inlet port, and a carrier gas mixture including said carrier gas and vapor deriving from said source reagent is dischargeable from said interior volume through said output port. At least one porous metal body is provide in the interior volume and adapted to support the source reagent in porosity thereof.

The invention correspondingly contemplates a method of generating a vapor from a volatilizable solid subjected to solid heating in a vaporizer vessel. The method involves disposing at least one porous metal body in the vaporizer vessel, wherein the porous metal body contains the volatilizable solid in porosity thereof.

In a further aspect, the invention contemplates a vaporizer for a solid source such as a low vapor pressure material. The vaporizer includes a single port vessel including a wall defining an enclosed interior volume, with a plurality of discrete support elements in such vessel interior volume in thermal contact with the wall and adapted to support solid source material in the interior volume. The support elements provide a structure for heating of the solid source material to form a solid source material vapor. The single port of the single port vessel in this embodiment is a discharge port communicating with the vessel interior volume and adapted for discharging solid source material vapor from the vessel.

FIG. 9 is a schematic representation of a vaporizer vessel 500 of such type.

In the FIG. 9 embodiment, the vaporizer 500 includes a vessel 502 fabricated as a cylindrical receptacle, to which a plate member 504 is secured, e.g., by welding, brazing, conductive bonding medium, mechanical fastening, or other affixation techniques, materials or elements. Alternatively, the vaporizer 500 can be integrally formed, with respect to the plate member 504 and the vessel 502, as a unitary structure. The vessel 502 and the plate member 504 together enclose the interior volume 506.

A plurality of fingers 510 are affixed at proximal ends thereof to the wall 508 of the vessel. For such purpose, the wall 508 may be formed with a plurality of openings therein, each sized to receive a finger 510 therein, so that the finger extends inwardly from the wall opening into the interior volume 506 of the vessel. These fingers can be secured to the associated openings, in any suitable manner that ensures and maintains the leak-tight integrity of the vessel.

The fingers can for example be formed with threading at their proximal ends, complementary to threading in the respective openings in the vessel wall 508, whereby the fingers can be threadably engaged with the wall 508. In this manner, the fingers are externally installable in and removable from the vessel. It will be appreciated that in lieu of such complementary threading on wall openings that accommodate the fingers therein, the fingers can be alternatively engaged with and secured to the wall.

Alternatively, the vessel 502 can be formed without any openings in the wall 508, and with the plate member 504 being removable from the vessel, as a two-piece construction. The fingers in such embodiments can be secured at their proximal ends to the interior wall surface of the wall 508 in any suitable manner, such as by welding, brazing, conductive bonding medium, mechanical fastening or other affixation techniques, materials or elements.

The fingers 510 can be arranged in the interior volume 506 in any suitable arrangement. For example, the fingers can be interdigitated with one another, as in the illustrated embodiment, or otherwise in spaced-apart relationship to one another, in spiral assemblies, rows, or other arrays. The fingers can extend upwardly from a base or floor portion of the vaporizer and/or they may project from the side walls and/or closure member for the vessel.

Each of the fingers 510 has an exterior surface 512 that is coated with a coating 514 of the solid source reagent. By such arrangement, heat can be inputted to the vessel wall 508 and transferred conductively to the fingers 510, e.g., by a thermal heating jacket surrounding the vessel, by radiant heating of the vessel, convective heating of the vessel, heating of the vessel wall by resistive heating elements embedded therein, or in other suitable fashion.

When the heat is transmitted to the fingers, the coating of source reagent material therein is volatilized to form a neat vapor of the source reagent.

The plate member 504 of the vaporizer in the illustrative embodiment has a valve head assembly thereon including a valve body with an interior flow passage therein communicating the interior volume 506 of the vaporizer vessel with a discharge fitting 524, to which piping, manifolding or other flow circuitry can be secured to the vaporizer for delivery of the precursor vapor to a downstream fluid-utilizing facility in which such precursor vapor is processed or otherwise used.

The interior flow passage of the valve body 520 contains a valve element that is selectively translatable between fully open and fully closed positions, and such valve element is mechanically coupled with the hand wheel 522, whereby the valve defined by the valve body can be opened to a desired extent, or closed to flow of precursor vapor.

Figure 9:
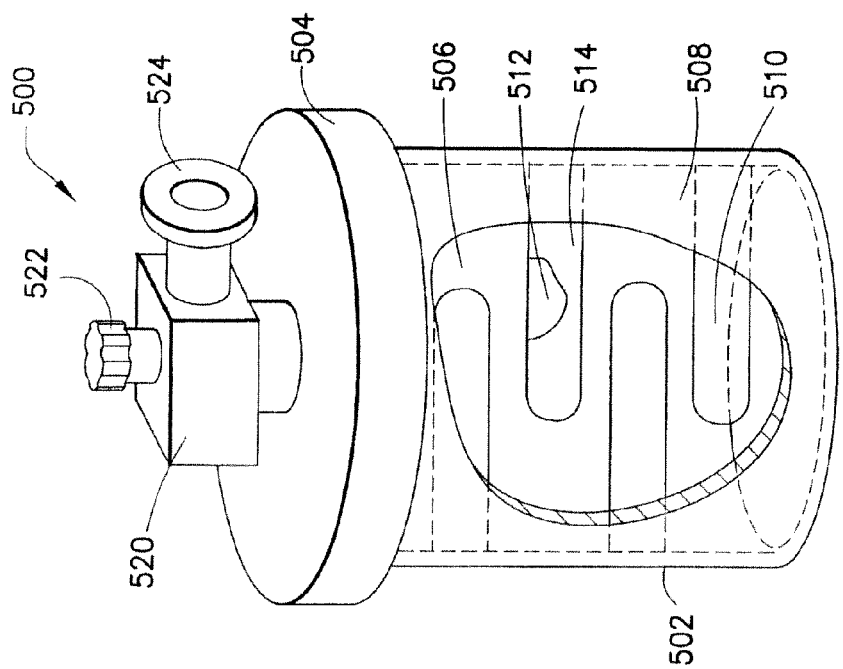
FIG. 9 is a schematic representation of a vaporizer vessel according to another embodiment of the invention.

The vaporizer 500 in FIG. 9 therefore is provided with only a single port for egress of precursor vapor formed by heating of the vaporizer vessel, so that the vapor flows from the interior volume 506 through the valve head 520 to the discharge fitting 524 with the valve defined by the valve body being open to accommodate such flow.

It will be recognized that the vessel of the vaporizer can be formed with one, two or multiple ports, and that the vessel may include a cover or be a unitary vessel configured for introduction of the source reagent chemistry thereto. For example, the vessel may be formed so that the source reagent chemistry can be inserted through and secured at the base of the vessel.

In another aspect, the invention contemplates the use of ionic liquids as storage media for source reagent materials, with the vaporizer vessel being adapted to hold the ionic liquid containing the source reagent. For example, the source reagent material can be dissolved in a suitable ionic liquid medium, with vapor of the dissolved source reagent material being released upon heating of the ionic liquid.

Ionic liquids media suitable for use in such applications may include, without limitation, acid/base neutral ionic liquids, or ionic liquids that act as reactive liquids, i.e., as Lewis acids, for effecting reversible reaction with the source reagent material to be stored. These reactive ionic liquids have a cation component and an anion component. The acidity or basicity of the reactive ionic liquids is governed by the strength of the cation, the anion, or by the combination of the cation and anion.

The most common ionic liquids comprise salts of tetraalkylphosphonium, tetraalkylammonium, N-alkylpyridinium or N,N'-dialkylimidazolium cations. Common cations contain $C_{1-18}$ alkyl groups (each of the individual alkyl groups in sequence, i.e., methyl, ethyl, propyl, butyl, pentyl, hexyl, . . . , being denoted by such nomenclature), and include, without limitation, the ethyl, butyl and hexyl derivatives of N-alkyl-N'-methylimidazolium and N-alkylpyridinium. Other cations include pyridazinium, pyrimidinium, pyrazinium, pyrazolium, triazolium, thiazolium, and oxazolium.

The so-called "task-specific" ionic liquids, bearing reactive functional groups on the cation, can be used. Task-specific ionic liquids can include aminoalkyl, such as aminopropyl; ureidopropyl, and thioureido derivatives of the above cations. Specific examples of task-specific ionic liquids containing functionalized cations include salts of 1-alkyl-3-(3-aminopropyl)imidazolium, 1-alkyl-3-(3-ureidopropyl)imidazolium, 1-alkyl-3-(3-thioureidopropyl)imidazolium, 1-alkyl-4-(2-diphenylphosphanylethyl)pyridinium, 1-alkyl-3-(3-sulfopropyl)imidazolium, and trialkyl-(3-sulfopropyl) phosphonium.

A wide variety of anions can be matched with the cation component of such ionic liquids for achieving a neutral ionic liquid or one that possesses Lewis acidity or Lewis basicity. One type of anion is derived from a metal halide. A frequently used halide is chloride although the other halides may also be used. Preferred metals for supplying the anion component, e.g., the metal halide, include copper, aluminum, iron, cobalt, chromium, zinc, tin, antimony, titanium, niobium, tantalum, gallium, and indium. Examples of metal chloride anions include $CuCl_2^-$, $Cu_2Cl_3^-$, $AlCl_4^-$, $Al_2Cl_7^-$, $CoCl_3^-$, $CrCl_4^-$, $ZnCl_3^-$, $ZnCl_4^{-2}$, $Zn_2Cl_5^-$, $FeCl_3^-$, $FeCl_4^-$, $Fe_2Cl_7^-$, $TiCl_5^-$, $TiCl_6^{-2}$, $SnCl_5^-$, $SnCl_6^{-2}$, etc.

Other commonly used anions include carboxylates, fluorinated carboxylates, sulfonates, fluorinated sulfonates, imides, borates, phosphates, chloride, etc. Preferred anions include $BF_4^-$, $PF_6^-$, $p-CH_3-C_6H_4SO_3^-$, $CF_3SO_3^-$, $CH_3OSO_3^-$, $CH_3CH_2OSO_3$, $(CF_3SO_2)_2N^-$, $(NC)_2N^-$ $(CF_3SO_2)_3C^-$, $CH_3COO^-$ and $CF_3COO^-$.

Examples of halide ionic liquid compounds from which other ionic liquids can be prepared include: 1-ethyl-3-methylimidazolium bromide; 1-ethyl-3-methylimidazolium chloride; 1-butyl-3-methylimidazolium bromide; 1-butyl-3-methylimidazolium chloride; 1-hexyl-3-methylimidazolium bromide; 1-hexyl-3-methylimidazolium chloride; 1-methyl-3-octylimidazolium bromide; 1-methyl-3-octylimidazolium chloride; monomethylamine hydrochloride; trimethylamine hydrochloride; tetraethylammonium chloride; tetramethyl guanidine hydrochloride; N-methylpyridinium chloride; N-butyl-4-methylpyridinium bromide; N-butyl-4-methylpyridinium chloride; tetrabutylphosphonium chloride; and tetrabutylphosphonium bromide.

Other suitable liquid carriers include oligomers and low molecular weight polymers, hyperbranched and dendritic amorphous polymers, natural and synthetic oils, etc. Specific examples of suitable liquid carriers include alkylene carbonates, glymes, polyether oils, perfluoropolyether oils, chlorotrifluoroethylene oils, hydrofluorocarbon oils, polyphenyl ether, silicone oils, fluorosilicone oils, hydrocarbon (refined petroleum) oils, hyperbranched polyethylene, hyperbranched polyether, polyester polyols, polyether polyols, polycarbonates, etc.

In use, the ionic liquid containing the dissolved source reagent therein may be heated to generate vapor of the dissolved source reagent at sufficient vapor pressure so that carrier gas contact with the ionic liquid and associated vapor will yield a source reagent-containing vapor containing the source reagent at appropriate concentration for the desired end use.

The invention in another aspect relates to a vaporizer including a vaporizer vessel enclosing an interior volume and having at least one gas port communicating with the interior volume of the vessel, an interior structure in the interior volume of the vessel and contacting the vessel and a source reagent material in contact with the interior structure, said source material including an outer crusted portion that is heatable to generate a source material vapor for egress from the vessel in dispensing operation of the vaporizer. The interior structure can include trays, metal foam, compartments, fins, extended area protrusions, etc., and the vessel can additionally include particle suppression feature and/or frit elements.

Figure 10:
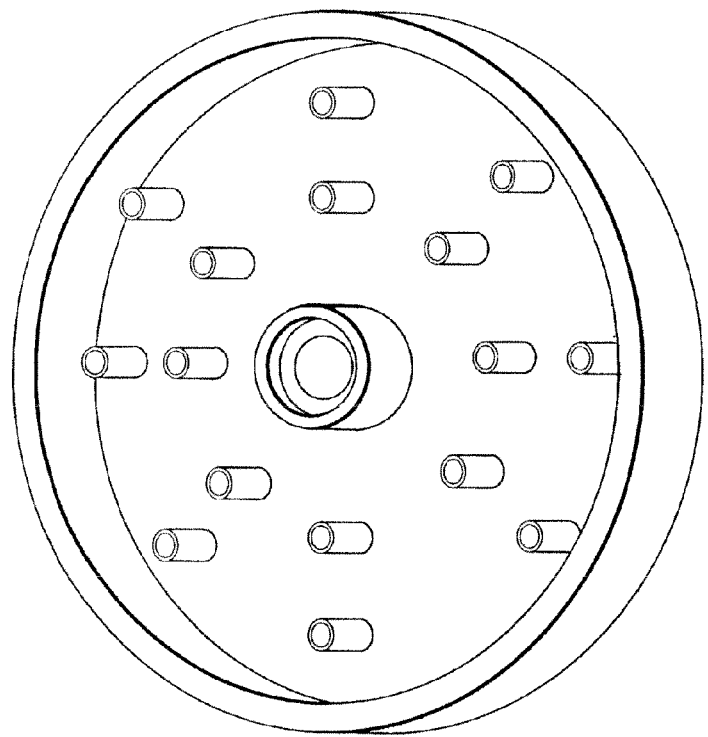
FIG. 10 is a perspective view photograph of a solid source reagent tray member of a type adapted to reside in a vaporizer vessel in accordance with the invention. The trade features a plurality of cylindrical flow channels therein to accommodate flow of vapor through the tray. A crusted portion of the source reagent is shown as having been removed from the bulk mass of the source reagent on the tray, following extended heat treatment of the source reagent to form such crusted material.

FIG. 10 is a perspective view photograph of a solid source reagent tray member of a type adapted to reside in a vaporizer vessel in accordance with the invention. The trade features a plurality of cylindrical flow channels therein to accommodate flow of vapor through the tray. A crusted portion of the source reagent is shown as having been removed from the bulk mass of the source reagent on the tray, following extended heat treatment of the source reagent to form such crusted material.

As shown in FIG. 10, a portion of the source reagent material has been removed from the bulk mass of the source reagent on the tray surface, and such removed portion includes an uppermost layer that has been densified by heat treatment of the granular powder form of the source reagent as initially applied to the tray.

As used herein, the term "crust" refers to an outer portion of a mass of source reagent material, which in such outer portion has a morphologically different form than the source reagent material in the bulk interior or underlying portion of such mass. The morphologically different character of the crustal portion may be a difference in density, crystalline or amorphous character, microstructure, degree of divided or continuous character, or difference of divided and continuous character (such as wherein the crustal portion is fused or continuous, and the inner bulk portion is divided or discontinuous, e.g., granular or particulate in character).

In one embodiment of the invention, a source reagent material, such as $ZrCl_4$ and $HfCl_4$, is heated for an extended period of time, e.g., at least 4 hours, and more preferably for a time of from 10 to 15 hours, at temperature above 235° C., such as in a range of from 235° C. to 250° C., to form a crust on the mass of source reagent material such as a granular mass of such material. It will be recognized that such elevated temperature processing may be widely varied in the practice of the present invention, in respect of specific source reagent materials that may be employed in the broad practice of the invention.

While the invention has been illustratively described herein, with respect to specific aspects, features and embodiments, it will be recognized at the scope of the invention as not thus limited, but rather extends to and encompasses other variations, modifications and alternative embodiments, as well suggest themselves to those of ordinary skill in the art based on the disclosure herein. Accordingly, all such alternative embodiments, variations and modifications are to be regarded as being within the spirit and scope of the invention as hereinafter claimed.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A closed vaporizer pre-loaded with a solid form source reagent for subsequent generation of source reagent vapor for dispensing operation, said vaporizer comprising a vaporizer vessel defining at least one port, and defining an enclosed interior volume, an interior structure disposed in the interior volume, said interior structure having a crusted layer of the solid form source reagent in contact with supporting surface of the interior structure, with the interior structure arranged in the interior volume so that the crusted layer in contact with the supporting surface of the interior structure is exposed for generation of the source reagent vapor during said dispensing operation, wherein the crusted layer of the solid form source reagent is present in the pre-loaded closed vaporizer, prior to use of the pre-loaded closed vaporizer for said generation of source reagent vapor for dispensing operation.

2. The vaporizer of claim 1, wherein the interior structure comprises a plurality of vertically stackable trays supporting the source reagent.

3. The vaporizer of claim 2, wherein at least one of the plurality of vertically stackable trays includes a plurality of extended area protrusions.

4. The vaporizer of claim 3, wherein the plurality of extended area protrusions comprise a plurality of cylindrical flow channels to accommodate flow of source reagent vapor.

5. The vaporizer of claim 3, wherein the plurality of extended area protrusions serve as a plurality of extended area heat transfer elements to facilitate volatilization of the source reagent by increasing a heated surface area to which the source reagent supported by the plurality of trays is exposed.

6. The vaporizer of claim 3, wherein the at least one port comprises at least one of an inlet port and an outlet port, and said inlet port is adapted to supply a carrier gas to the interior volume to contact said source reagent.

7. The vaporizer of claim 6, wherein a first portion of the plurality of extended area protrusions in a first tray of the plurality of vertically stackable trays are off-set in relation to a second portion of the plurality of extended area protrusions in a second tray of the plurality of vertically stackable trays, so that the carrier gas flows over the source reagent in the first tray before passing into the second portion of the plurality of extended area protrusions in the second tray to promote entrainment of vaporized source reagent in the carrier gas.

8. The vaporizer of claim 1, wherein the supporting surface comprises vertical surface.

9. The vaporizer of claim 1, wherein the source reagent comprises a material selected from the group consisting of: dimethyl hydrazine, trimethyl aluminum (TMA), hafnium tetrachloride ($HfCl_4$), zirconium tetrachloride ($ZrCl_4$), indium trichloride, indium monochloride, aluminum trichloride, titanium iodide, tungsten carbonyl, $Ba(DPM)_2$, his di pivaloyl methanato strontium ($Sr(DPM)_2$), $TiO(DPM)_2$, tetra di pivaloyl methanato zirconium ($Zr(DPM)_4$), decaborane, octadecaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide (Zr (t-OBu)$_4$), tetrakisdiethylaminozirconium (Zr(Net$_2$)$_4$), tetrakisdiethylaminohafnium (Hf(NEt$_2$)$_4$), tetrakis (dimethylamino) titanium (TDMAT), tertbutyliminotris (deithylamino) tantalum (TBTDET), pentakis (demethylamino) tantalum (PDMAT), pentakis (ethylmethylamino) tantalum (PEMAT), tetrakisdimethylaminozirconium (Zr (NMe$_2$)$_4$), hafniumtertiarybutoxide (Hf(tOBu)$_4$), xenon difluoride (XeF$_2$), xenon tetrafluoride (XeF$_4$), xenon hexafluoride (XeF$_6$), metalorganic β-diketonate complexes, tungsten hexafluoride, cyclopentadienylcycloheptatrienyl-titanium (C$_p$TiCht), cyclooctatetraenecyclo-pentadienyltitanium, bis-cyclopentadienyltitaniumdiazide, trimethyl gallium, trimethyl indium, aluminum alkyls, trimethylaluminum, triethylaluminum, trimethylamine alane, dimethyl zinc, tetramethyl tin, trimethyl antimony, diethyl cadmium, tungsten carbonyl, metal halides, gallium halides, indium halides, antimony halides, arsenic halides, aluminum iodide, titanium iodide; metalorganic complexes, In(CH$_3$)$_2$(hfac), dibromomethyl stibine, tungsten carbonyl, metalorganic alkoxide complexes, metalorganic carboxylate complexes, metalorganic aryl complexes and metalorganic amido complexes, and compatible combinations and mixtures of two or more of the foregoing.

10. The vaporizer of claim 1, wherein the interior structure comprises stackable trays having a sidewall upwardly extending from a floor defining the supporting surface, wherein the crusted layer of the solid form source reagent is in contact with the sidewall, and wherein the solid form source reagent comprises hafnium tetrachloride (HfCl$_4$).

11. The vaporizer of claim 1, wherein the interior structure comprises stackable trays having a sidewall upwardly extending from a floor defining the supporting surface, wherein the crusted layer of the solid form source reagent is in contact with the sidewall, and wherein the solid form source reagent comprises zirconium tetrachloride (ZrCl$_4$).

12. The vaporizer of claim 1, wherein the interior structure comprises vertical supporting surface, and wherein the solid form source reagent comprises hafnium tetrachloride (HfCl$_4$).

13. The vaporizer of claim 1, wherein the interior structure comprises vertical supporting surface, and wherein the solid form source reagent comprises zirconium tetrachloride (ZrCl$_4$).

14. The vaporizer of claim 1, wherein the crusted layer has been formed by heating of a granular powder form of the source reagent initially applied to the supporting surface, for a period of time of at least four hours and temperature above 235° C.

15. A closed vaporizer pre-loaded with a solid form source reagent for subsequent generation of source reagent vapor for dispensing operation, said vaporizer comprising a vaporizer vessel defining at least one port, and defining an enclosed interior volume, at least one interior structure disposed in the interior volume, said at least one interior structure having a crusted layer of the solid form source reagent in contact with supporting surface of the interior structure, with the interior structure arranged in the interior volume so that the crusted layer in contact with the supporting surface of the interior structure is exposed for generation of the source reagent vapor during said dispensing operation, wherein the at least one interior structure comprises at least one of: (i) stackable trays having a sidewall upwardly extending from a floor defining the supporting surface, wherein the crusted layer of the solid form source reagent is in contact with the sidewall, and (ii) interior structure elements comprising vertical supporting surface, wherein the crusted layer of the solid form source reagent is present in the pre-loaded closed vaporizer, prior to use of the pre-loaded closed vaporizer for said generation of source reagent vapor for dispensing operation.

16. A closed vaporizer pre-loaded with a solid form source reagent for subsequent vaporization of the solid form source reagent in a dispensing operation, said vaporizer comprising a vaporizer vessel defining an inlet port and an outlet port, and defining an enclosed interior volume, wherein said inlet port is adapted to supply a carrier gas to the interior volume to contact said source reagent, interior structure comprising a tray disposed in the interior volume, the tray having a crusted layer of the solid form source reagent in contact with supporting surface of the tray, with the tray arranged in the interior volume so that the crusted layer in contact with the supporting surface of the tray is exposed for generation of the source reagent vapor and entrainment thereof in the carrier gas supplied to the interior volume to form a carrier gas mixture that flows to the outlet port for discharge from the vaporizer vessel, wherein the crusted layer has been formed prior to the contact of the source reagent with the carrier gas, and wherein the crusted layer of the solid form source reagent is present in the pre-loaded closed vaporizer, prior to use of the pre-loaded closed vaporizer for said generation of source reagent vapor for dispensing operation.

17. The vaporizer of claim 16, wherein the tray has been arranged in the interior volume of the vaporizer vessel after the crusted layer coated on the supporting surface of the tray has been formed thereon.

18. The vaporizer of claim 17, wherein the solid form source reagent comprises hafnium tetrachloride.

19. The vaporizer of claim 17, wherein the solid form source material comprises zirconium tetrachloride.

20. The vaporizer of claim 16, wherein the interior structure comprises a multiplicity of trays, vertically spaced apart from one another.

21. The vaporizer of claim 16, wherein the crusted layer in contact with the supporting surface of the tray includes an uppermost layer that has been densified by heat treatment of a granular powder of the solid form source material that has been initially applied to the tray.

* * * * *

UNITED STATES PATENT AND TRADEMARK OFFICE
CERTIFICATE OF CORRECTION

| | |
|---|---|
| PATENT NO. | : 8,821,640 B2 |
| APPLICATION NO. | : 12/438502 |
| DATED | : September 2, 2014 |
| INVENTOR(S) | : John M. Cleary et al. |

Page 1 of 1

It is certified that error appears in the above-identified patent and that said Letters Patent is hereby corrected as shown below:

In the Specification,

Column 5, line 51: "aide" should be -- article --.

Column 19, line 19: "fits" should be -- frits --.

In the Claims,

Column 28, line 65: "his" should be -- bis --.

Signed and Sealed this
Eleventh Day of November, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,821,640 B2 | Page 1 of 1 |
| APPLICATION NO. | : 12/438502 | |
| DATED | : September 2, 2014 | |
| INVENTOR(S) | : John M. Cleary et al. | |

It is certified that error appears in the above-identified patent and that said Letters Patent is hereby corrected as shown below:

In the Specification,

Column 5, line 51: "aide" should be -- article --.

Column 9, line 19: "fits" should be -- frits --.

In the Claims,

Column 28, line 65: "his" should be -- bis --.

This certificate supersedes the Certificate of Correction issued November 11, 2014.

Signed and Sealed this
Twenty-fourth Day of March, 2015

Michelle K. Lee
*Director of the United States Patent and Trademark Office*